(12) United States Patent
Hosokawa et al.

(10) Patent No.: US 12,707,767 B2
(45) Date of Patent: Aug. 11, 2026

(54) SEMICONDUCTOR LIGHT-EMITTING ELEMENT

(71) Applicant: NICHIA CORPORATION, Anan (JP)

(72) Inventors: Yasunobu Hosokawa, Tokushima (JP); Takumi Otsuka, Anan (JP)

(73) Assignee: NICHIA CORPORATION, Anan (JP)

( * ) Notice: Subject to any disclaimer, the term of this patent is extended or adjusted under 35 U.S.C. 154(b) by 539 days.

(21) Appl. No.: 18/306,875

(22) Filed: Apr. 25, 2023

(65) Prior Publication Data

US 2023/0352629 A1 Nov. 2, 2023

(30) Foreign Application Priority Data

Apr. 28, 2022 (JP) ................................ 2022-075313
Oct. 31, 2022 (JP) ................................ 2022-174708
Mar. 20, 2023 (JP) ................................ 2023-044471

(51) Int. Cl.
*H10H 20/831* (2025.01)
*H10H 20/819* (2025.01)
(Continued)

(52) U.S. Cl.
CPC ...... *H10H 20/8312* (2025.01); *H10H 20/819* (2025.01); *H10H 20/825* (2025.01); *H10H 20/857* (2025.01)

(58) Field of Classification Search
CPC ............ H10H 20/8312; H10H 20/819; H10H 20/825; H10H 20/857; H10H 20/831;
(Continued)

(56) References Cited

U.S. PATENT DOCUMENTS 11,527,679 B2 * 12/2022 Wu ...................... H10H 20/831
2006/0231852 A1 10/2006 Kususe et al.
(Continued)

FOREIGN PATENT DOCUMENTS

JP 2004-071644 A 3/2004
JP 2011-119491 A 6/2011
(Continued)

*Primary Examiner* — Su C Kim
(74) *Attorney, Agent, or Firm* — Foley & Lardner LLP

(57) ABSTRACT

A semiconductor light-emitting element includes a semiconductor structure including an n-side semiconductor layer including a first region, a second region located on an outer periphery of the first region, and a plurality of third regions surrounded by the first region in a plan view, a light-emitting layer disposed on the first region, and a p-side semiconductor layer disposed on the light-emitting layer; a first insulating film disposed on the semiconductor structure and defining a plurality of first openings, each located above a corresponding one of the plurality of third regions and a plurality of second openings located above the p-side semiconductor layer; an n-side electrode disposed on the first insulating film and electrically connected to the n-side semiconductor layer through the plurality of first openings; at least one n-pad electrode disposed in the second region and electrically connected to the n-side electrode; a second insulating film disposed on the first insulating film and defining a plurality of third openings, each located at a position overlapping a corresponding one of the plurality of second openings; and a p-pad electrode disposed on the second insulating film and electrically connected to the p-side semiconductor layer through the plurality of third openings. The p-pad electrode covers the first region and the plurality of third regions in a plan view. Two or more of the plurality of first openings are located around a corresponding one of the plurality of third openings in a plan view.

12 Claims, 13 Drawing Sheets

(51) Int. Cl.
*H10H 20/825* (2025.01)
*H10H 20/857* (2025.01)

(58) Field of Classification Search
CPC ........... H10H 20/8585; H10H 20/8316; H10H 20/821; H10H 20/83; H10H 20/858
See application file for complete search history.

(56) References Cited

U.S. PATENT DOCUMENTS

2008/0251808 A1 10/2008 Kususe et al.
2012/0025256 A1 2/2012 Kususe et al.
2012/0241721 A1 9/2012 Hodota et al.
2013/0193467 A1 8/2013 Kususe et al.
2013/0334552 A1* 12/2013 Yang .................. H10H 20/8312 257/98
2017/0033262 A1 2/2017 Takenaga et al.
2017/0141260 A1* 5/2017 Chen .................... H10H 20/841
2017/0263817 A1 9/2017 Hirano et al.
2019/0016198 A1* 1/2019 Kim .................. B32B 17/10027
2019/0044027 A1* 2/2019 Lee ...................... H10H 20/814
2022/0320398 A1 10/2022 Barthel et al.

FOREIGN PATENT DOCUMENTS

JP 2014-036080 A 2/2014
JP 2016-115688 A 6/2016
JP 5985782 B1 9/2016
JP 2016-207725 A 12/2016
JP 2017-034231 A 2/2017
KR 2020-0048778 A 5/2020
WO WO-2020/234112 A1 11/2020

* cited by examiner

SEMICONDUCTOR LIGHT-EMITTING ELEMENT

CROSS-REFERENCE TO RELATED APPLICATIONS

This application claims priority to Japanese Patent Application No. 2022-75313, filed on Apr. 28, 2022, Japanese Patent Application No. 2022-174708, filed on Oct. 31, 2022, and Japanese Patent Application No. 2023-044471, filed on Mar. 20, 2023. The disclosures of these applications are hereby incorporated by reference in their entireties.

BACKGROUND

The present disclosure relates to a semiconductor light-emitting element.

Japanese Patent No. 5985782 discloses a light-emitting element including a semiconductor layered portion in which a first semiconductor layer, an active layer, and a second semiconductor layer are layered, an n-electrode electrically connected to the first semiconductor layer, and a p-electrode electrically connected to the second semiconductor layer. In Japanese Patent No. 5985782, it has been proposed that a first plated electrode formed on the p-electrode in the light-emitting element is formed to cover a conductive portion between the first semiconductor layer and the n-electrode.

SUMMARY

Further improvement in light-emitting efficiency and heat dissipation is demanded for a semiconductor light-emitting element as disclosed in Japanese Patent No. 5985782.

An object of the present disclosure is to provide a semiconductor light-emitting element having high light-emitting efficiency and improved heat dissipation.

A semiconductor light-emitting element according to the present disclosure includes a semiconductor structure including an n-side semiconductor layer including a first region, a second region located on an outer periphery of the first region, and a plurality of third regions surrounded by the first region in a plan view, a light-emitting layer disposed on the first region, and a p-side semiconductor layer disposed on the light-emitting layer; a first insulating film disposed on the semiconductor structure and defining a plurality of first openings, each located above a corresponding one of the plurality of third regions and a plurality of second openings located above the p-side semiconductor layer; an n-side electrode disposed on the first insulating film and electrically connected to the n-side semiconductor layer through the plurality of first openings; at least one n-pad electrode disposed in the second region and electrically connected to the n-side electrode; a second insulating film disposed on the first insulating film and defining a plurality of third openings, each located at a position overlapping a corresponding one of the plurality of second openings; and a p-pad electrode disposed on the second insulating film and electrically connected to the p-side semiconductor layer through the plurality of third openings. The p-pad electrode covers the first region and the plurality of third regions in a plan view. Two or more of the plurality of first openings are located around a corresponding one of the plurality of third openings in a plan view.

The semiconductor light-emitting element according to the present disclosure having a configuration as described above can have improved light-emitting efficiency and heat dissipation.

DETAILED DESCRIPTION

Figure 1:
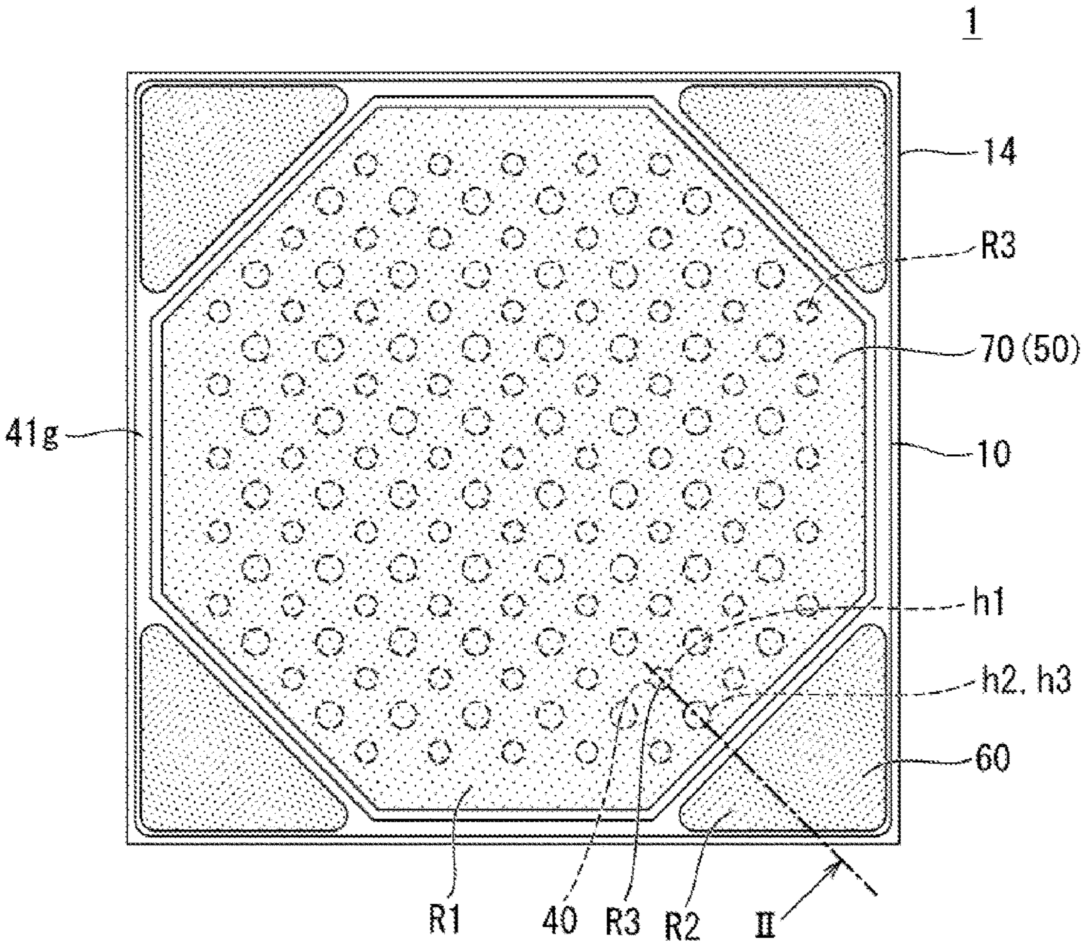
FIG. 1 is a schematic plan view of a semiconductor light-emitting element of an embodiment according to the present disclosure.
Figure 2:
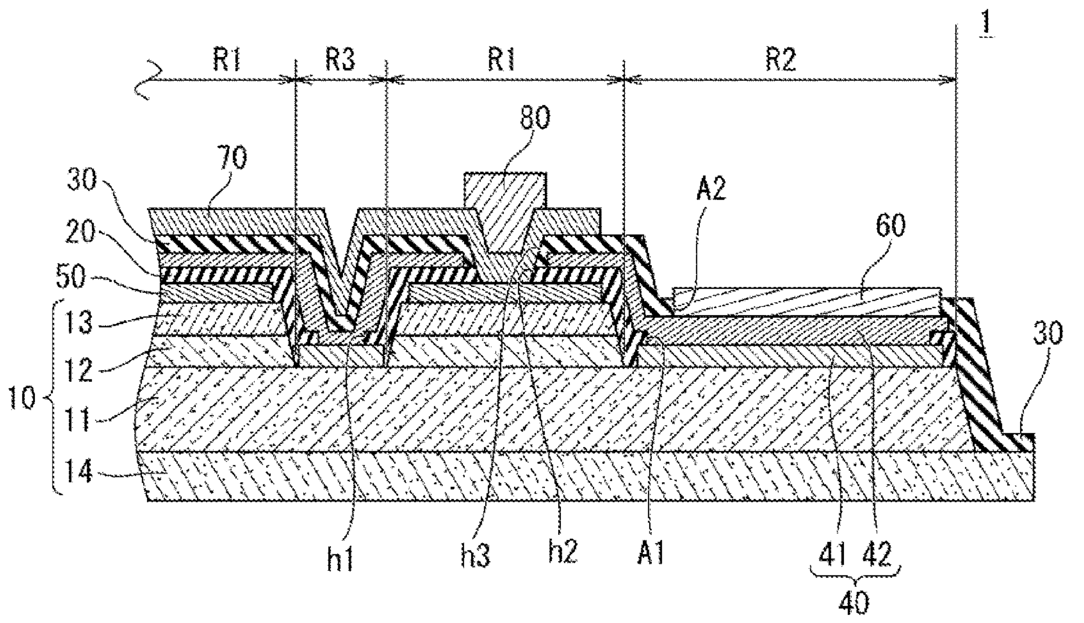
FIG. 2 is a schematic cross-sectional view of the semiconductor light-emitting element of the embodiment according to the present disclosure.

As illustrated in FIGS. 1 and 2, a semiconductor light-emitting element 1 of the present disclosure includes a semiconductor structure 10, a first insulating film 20, a second insulating film 30, an n-side electrode 40, at least one n-pad electrode 60, and a p-pad electrode 70. The semiconductor structure 10 includes an n-side semiconductor layer 11, a light-emitting layer 12, and a p-side semiconductor layer 13. The n-side semiconductor layer 11 includes a first region R1, a second region R2 located on the outer periphery of the first region R1, and a plurality of third regions R3, each surrounded by the first region R1. The first insulating film 20 defines a plurality of first openings h1, each located above a corresponding one of the plurality of third region R3 and a plurality of second openings h2 located above the p-side semiconductor layer 13. The second insulating film 30 defines a plurality of third openings h3, each located at a position overlapping a corresponding one of the plurality of second openings h2. The n-side electrode 40 is electrically connected to the n-side semiconductor layer 11 through the plurality of first openings h1. The n-side electrode 40 is electrically connected to the n-pad electrode 60. The n-side semiconductor layer 11 and the n-pad electrode 60 are electrically connected together via the n-side electrode 40. The p-pad electrode 70 is disposed on the second insulating film 30 and is electrically connected to the p-side semiconductor layer 13 through the plurality of third openings h3. In a plan view, the p-pad electrode 70 covers the first region R1 and the third region R3, and two or more of the plurality of first openings h1 are located around a corresponding one of the third openings h3.

According to the above configuration, the p-pad electrode 70 covers the first region R1 and the third region R3 in a plan view, so that heat generated in the semiconductor light-emitting element 1 can be dissipated by the p-pad electrode 70. Furthermore, in a plan view, two or more first openings h1 are formed around a third opening h3. Thus, when a current flows through the semiconductor light-emitting element 1, electrons supplied from the n-side electrode 40 through the first opening h1 easily move toward the third opening h3 (p-side semiconductor layer side) formed around the first opening h1. This configuration can improve the light-emitting efficiency of the semiconductor light-emitting element 1.

As described above, in the semiconductor light-emitting element of the present disclosure, light-emitting efficiency can be improved and heat generated by light emission of the semiconductor light-emitting element can be appropriately dissipated.

Figure 3:
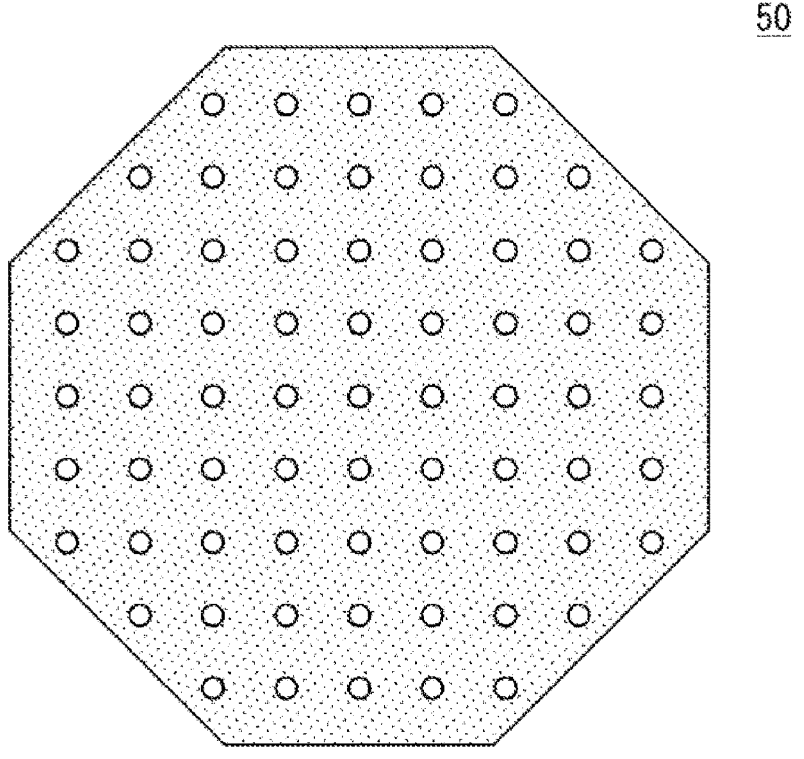
FIG. 3 is a schematic plan view of a p-side electrode of the semiconductor light-emitting element.
Figure 4:
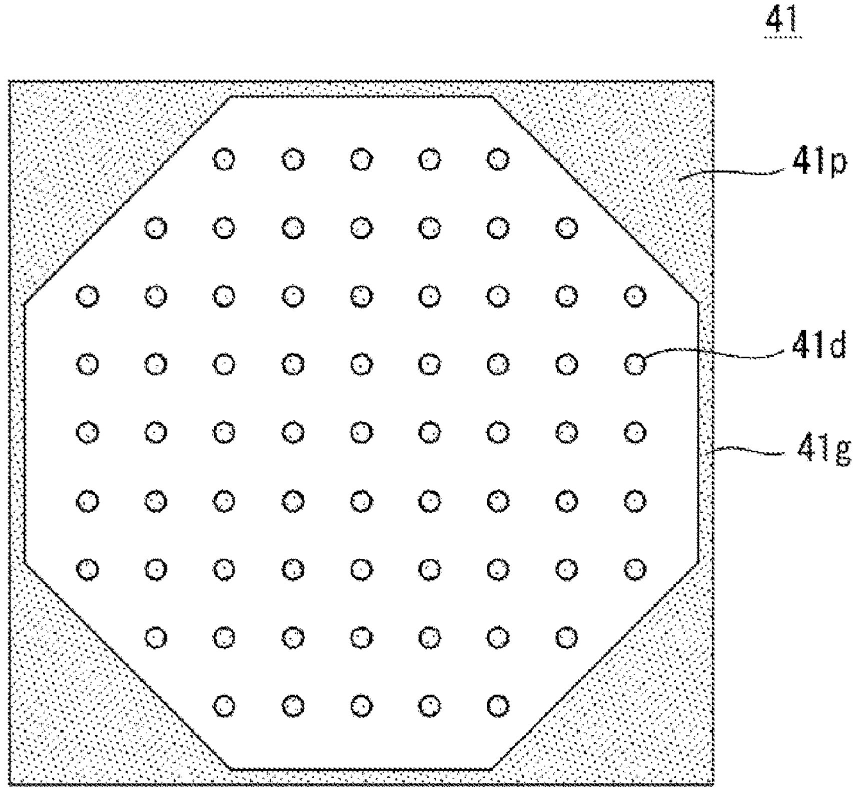
FIG. 4 is a schematic plan view of an n-side contact electrode of the semiconductor light-emitting element.
Figure 5:
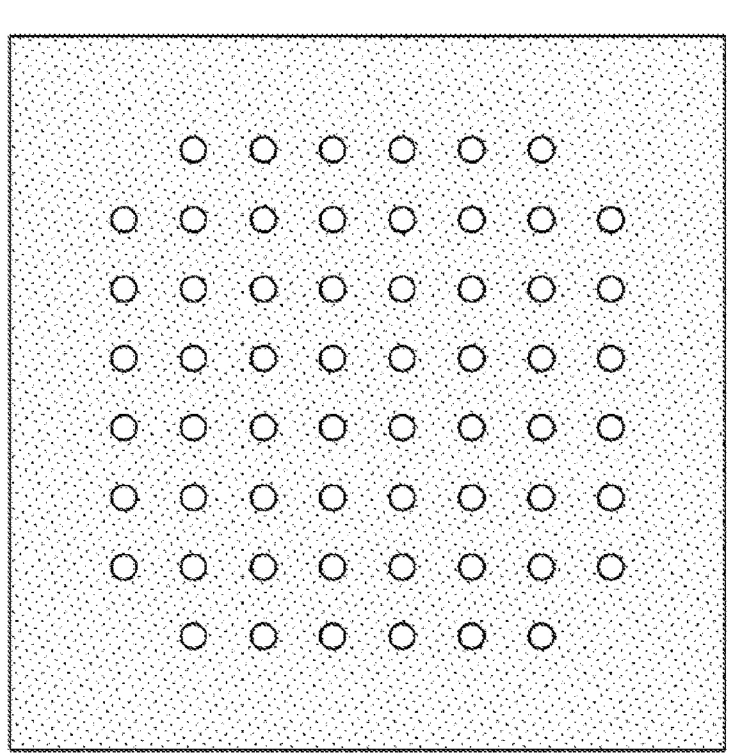
FIG. 5 is a schematic plan view of an n-side wiring portion of the semiconductor light-emitting element.
Figure 6:
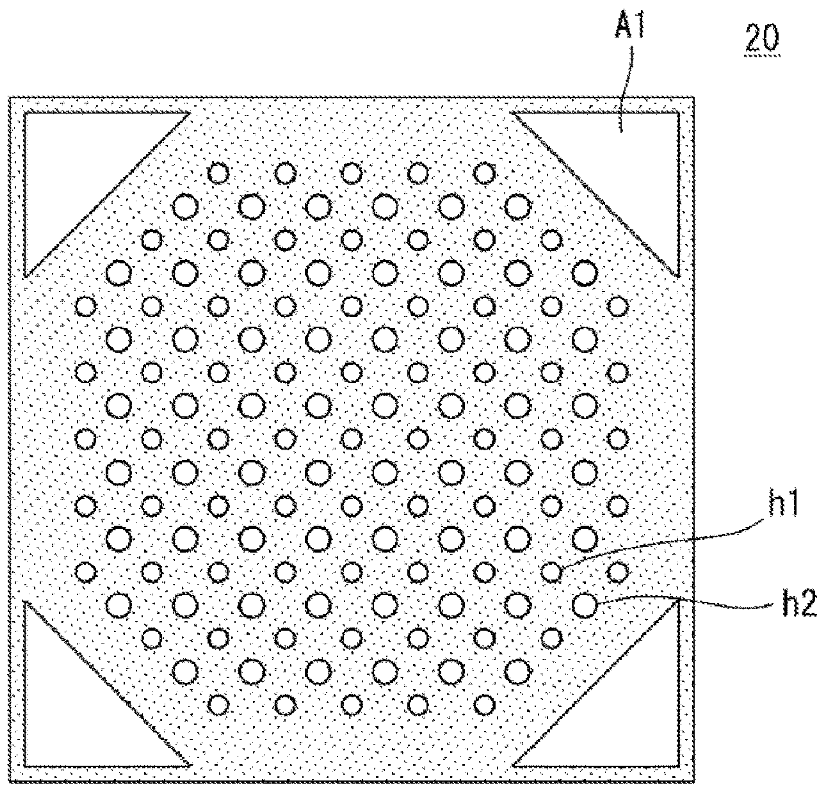
FIG. 6 is a schematic plan view of a first insulating film of the semiconductor light-emitting element.
Figure 7:
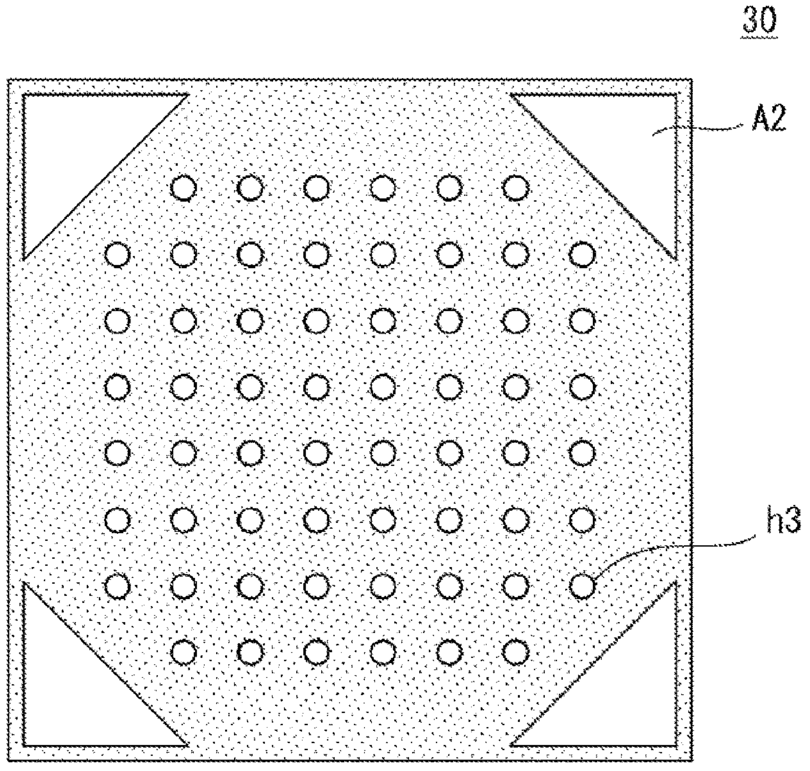
FIG. 7 is a schematic plan view of a second insulating film of the semiconductor light-emitting element.

Hereinafter, a more specific form will be described in detail. FIG. 1 is a schematic plan view of the semiconductor light-emitting element according to an embodiment of the present disclosure. FIG. 2 is a schematic cross-sectional view of the semiconductor light-emitting element according to the embodiment of the present disclosure. FIG. 3 is a schematic plan view of the p-side electrode of the semiconductor light-emitting element. FIG. 4 is a schematic plan view of the n-side contact electrode of the semiconductor light-emitting element. FIG. 5 is a schematic plan view of the n-side wiring portion of the semiconductor light-emitting element. FIG. 6 is a schematic plan view of the first insulating film of the semiconductor light-emitting element. FIG. 7 is a schematic plan view of the second insulating film of the semiconductor light-emitting element. First, a semiconductor light-emitting element according to one embodiment of the present disclosure will be described with reference to FIGS. 1 to 7.

Embodiment of Semiconductor Light-Emitting Element

The semiconductor light-emitting element 1 according to a first embodiment of the present disclosure includes the semiconductor structure 10, the n-side electrode 40, the n-pad electrode 60, the first insulating film 20, the second insulating film 30, a p-side electrode 50, and the p-pad electrode 70.

1. Semiconductor Structure

The semiconductor structure 10 includes the n-side semiconductor layer 11, the light-emitting layer 12, and the p-side semiconductor layer 13 on a substrate 14. In a plan view, the semiconductor structure 10 has, for example, a rectangular shape. In one example, a nitride semiconductor such as $In_XAl_YGa_{1-X-Y}N$ ($0 \leq X$, $0 \leq Y$, $X+Y \leq 1$) is used for the semiconductor structure 10. Examples of the nitride semiconductor include GaN, InGaN, AlGaN, and AlInGaN. The light-emitting layer 12 can have, for example, a quantum well structure including a plurality of well layers and a plurality of barrier layers. As an example, the semiconductor structure 10 emits light of ultraviolet light (for example, a UV-B having a peak wavelength in a range of 280 nm to 315 nm or a UV-C having a peak wavelength in a range of 100 nm to 280 nm). In particular, in a case in which light having a wavelength of the above-described UV-B or UV-C is emitted, the light-emitting layer 12 preferably includes an AlGaN layer having an Al composition ratio in a range of 40% to 60%. The light-emitting layer 12 includes a well layer and a barrier layer, each made of an AlGaN layer having an Al composition ratio in a range of 40% to 60%, for example.

The n-side semiconductor layer 11 includes the first region R1 in which the light-emitting layer 12 and the p-side semiconductor layer 13 are disposed, and the second region R2 and the third region R3 in which the light-emitting layer 12 and the p-side semiconductor layer 13 are not disposed (see FIGS. 1 and 2).

As illustrated in FIG. 1, in a plan view, the first region R1 is located at the center of the semiconductor structure 10 and has a continuous surface. The outer shape of the first region R1 is, for example, substantially octagonal. When the first region R1 has a substantially octagonal shape, it is possible to reduce the quantity of the light-emitting layers 12 located in the vicinity of the position irradiated with the laser light in a step of cleaving the substrate 14 described below, as compared with the case in which the outer shape of the first region R1 is substantially quadrangular. This can reduce deterioration of the light-emitting layer 12 due to laser light.

The second region R2 is located on the outer periphery of first region R1 and includes a region in which the n-pad electrode 60 is disposed. In FIGS. 1 and 4, the second regions R2 are disposed along the outer periphery of the semiconductor structure 10. The second regions R2 surround the first region R1. The second region R2 is not limited to be in such a form. For example, the second region R2 may be, instead of surrounding the first region R1, disposed only at each of four corners of the semiconductor structure 10 or at at least one corner of the semiconductor structure 10. In the example herein, as illustrated in FIG. 2, the light-emitting layer 12 and the p-side semiconductor layer 13 are not disposed in the second region R2. Thus, light absorption by the light-emitting layer 12 and the p-side semiconductor layer 13 in the second region R2 can be reduced as compared with the case in which the light-emitting layer 12 and the p-side semiconductor layer 13 are disposed in the second region R2.

The third region R3 is a region for achieving electrical connection between the n-side electrode 40 and the n-side semiconductor layer 11. The third region R3 corresponds to the exposed position of the n-side semiconductor layer 11. The plurality of third regions R3 are disposed in the semiconductor structure 10. Each of the plurality of third regions R3 is surrounded by the first region R1. In a plan view of the semiconductor structure 10, the plurality of third regions R3 are disposed in the continuous first region R1. The plurality of third regions R3 are disposed in an island-like manner. In the present description, the term “island-like” refers to a discontinuous state in which the regions are individually separated from one another in a plan view.

2. p-Side Electrode

The p-side electrode 50 is electrically connected to the p-side semiconductor layer 13 located in the first region R1. For the p-side electrode 50, it is preferable to use a metal that reflects light from the light-emitting layer 12 toward the n-side semiconductor layer 11. For the p-side electrode 50, it is preferable to use a metal having a reflectance of 50% or more, preferably 60% or more, with respect to a peak wavelength of light from the light-emitting layer 12, for example, and it is preferable to use a metal such as Rh or Ru, for example. The p-side electrode 50 may have a layered structure in which a plurality of metal layers are layered. The p-side electrode 50 may have, for example, a layered structure in which an Ru layer, an Ni layer, and an Au layer are layered in order from a surface of the p-side electrode 50 facing the semiconductor structure 10. The p-side electrode 50 may have, for example, a layered structure in which a Ti layer, an Rh layer, and a Ti layer are layered in order from the semiconductor structure 10 side. The p-side electrode 50 may have a thickness, for example, in a range of 300 nm to 1500 nm. The p-side electrode 50 is formed on substantially the entirety of an upper surface of the p-side semiconductor layer 13. The outer shape of the p-side electrode 50 is substantially octagonal in a plan view. The p-side electrode 50 is not disposed in the second region R2 and the third region R3.

3. n-Side Electrode

As illustrated in FIG. 2, the n-side electrode 40 includes an n-side contact electrode 41 and an n-side wiring portion 42. The n-side contact electrode 41 is in contact with the n-side semiconductor layer 11 and is electrically connected to the n-side semiconductor layer 11. The n-side wiring portion 42 is in contact with the n-side contact electrode 41 and is electrically connected to the n-side semiconductor layer 11 via the n-side contact electrode 41. In a plan view of the semiconductor light-emitting element 1, the n-side contact electrode 41 and the p-side electrode 50 are separated from each other. In a plan view of the semiconductor light-emitting element 1, a part of the n-side wiring portion 42 overlaps a part of the p-side electrode 50.

For the n-side contact electrode 41, for example, a metal such as Ti, Al, Ni, Ta, Rh, Ru, Si, or Pt, or an alloy containing these metals as a main component can be used. As an example, the n-side contact electrode 41 can have a layered structure in which a Ti layer, an Al alloy layer, a Ta layer, an Ru layer, and a Ti layer are layered in order from a surface of the n-side contact electrode 41 facing the n-side semiconductor layer 11. The n-side contact electrode 41 may have a thickness, for example, in a range of 500 nm to 800 nm. As illustrated in FIG. 4, the n-side contact electrode 41 is disposed in the second region R2 and the third region R3. The n-side contact electrode 41 includes a contact portion 41*p*, an n-side outer-peripheral conductive portion 41*g*, and a plurality of n-side conductive portions 41*d*. The contact portion 41*p* is disposed in the second region R2 located at the corner of the semiconductor structure 10 and is in contact with the n-side semiconductor layer 11. The contact portion 41*p* is disposed at a position corresponding to the n-pad electrode 60 described below. The n-side outer-peripheral conductive portion 41*g* is in contact with the n-side semiconductor layer 11 in the second region R2 not overlapping the n-pad electrode 60 in a plan view of the second region R2. The plurality of n-side conductive portions 41*d* are disposed in the corresponding third regions R3 and are in contact with the n-side semiconductor layer 11. The plurality of n-side conductive portions 41*d* are disposed in an island-like manner in a plan view. The plurality of n-side conductive portions 41*d* are in contact with the n-side semiconductor layer 11 through the corresponding first openings h1 described below. In a plan view, the distance between center points of two adjacent n-side conductive portions 41*d* is preferably in a range of 45 μm to 100 μm, and more preferably in a range of 45 μm to 80 μm. In the example herein, the center point of the n-side conductive portion 41*d* is a center point of a shape of the n-side conductive portion 41*d* in a plan view. For example, in the n-side conductive portion 41*d* having a circular shape in a plan view illustrated in FIG. 4, the center of the circle is the center point of the n-side conductive portion 41*d*. The n-side outer-peripheral conductive portion 41*g* may be located outward of the outer edge of the p-pad electrode 70 described below in a plan view.

As the n-side wiring portion 42, the same metal as that of the n-side contact electrode 41 described above can be used. As an example, the n-side wiring portion 42 can have a layered structure in which a Ti layer, an Al alloy layer, and a Ti layer are layered in order from a surface of the n-side wiring portion 42 facing the semiconductor structure 10. The n-side wiring portion 42 may have a thickness, for example, in a range of 400 nm to 600 nm. As illustrated in FIGS. 4 and 5, the n-side wiring portion 42 electrically connects the n-side outer-peripheral conductive portion 41*g* and the plurality of contact portions 41*p* disposed in the above-described second region R2 and the plurality of n-side conductive portions 41*d* disposed in the third region R3.

In a plan view, the n-side wiring portion 42 continuously covers the semiconductor structure 10. In other words, the n-side wiring portion 42 covers the entire semiconductor structure 10. As illustrated in FIG. 5, the n-side wiring portion 42 includes a plurality of openings. Each of the plurality of openings of the n-side wiring portion 42 is disposed at a position overlapping the corresponding one of the second openings h2 of the first insulating film 20 described below.

In a cross-sectional view, the n-side wiring portion 42 covers a part of the lateral surface of the semiconductor structure 10 and a part of the upper surface of the semiconductor structure 10. With the n-side wiring portion 42 covering the semiconductor structure 10 in a plan view, light directed to the n-side wiring portion 42 of light from the light-emitting layer 12 can be reflected toward the substrate 14.

4. First Insulating Film

As illustrated in FIG. 2, the first insulating film 20 is disposed on the semiconductor structure 10. In a cross-sectional view, the first insulating film 20 is disposed between the n-side contact electrode 41 and the p-side electrode 50 and electrically insulates the n-side contact electrode 41 and the p-side electrode 50 from each other. The first insulating film 20 is disposed between the n-side wiring portion 42 and the p-side electrode 50 and electrically insulates the n-side wiring portion 42 and the p-side electrode 50 from each other. The first insulating film 20 includes the plurality of first openings h1 for electrically connecting the n-side wiring portion 42 and the n-side contact electrode 41, and the plurality of second openings h2 for electrically connecting the p-side electrode 50 and the p-pad electrode 70. The first insulating film 20 defines the plurality of first openings h1 located above the third region R3 and the plurality of second openings h2 located above the first region R1.

As illustrated in FIG. 1, in the semiconductor light-emitting element 1 according to the first embodiment of the present disclosure, the plurality of first openings h1 are located around the second opening h2. For example, four first openings h1 are formed for a single second opening h2. In a direction parallel to the diagonal line of the substrate 14, the first opening h1 is located between, for example, two adjacent second openings h2. In a plan view, the first opening h1 and the second opening h2 are arranged in alternate rows. In the present description, the expression "in alternate rows" is intended to indicate a state in which the plurality of first openings h1 and the plurality of second openings h2 are alternately arranged.

In the direction parallel to one side of the substrate 14, the first opening h1 may be formed between two adjacent second openings h2. The plurality of second openings h2 may be located around the first opening h1. In a plan view, the plurality of first openings h1 and the plurality of second openings h2 are preferably formed at substantially equal intervals. This configuration can improve the uniformity of distribution of emission intensity.

As illustrated in FIGS. 2 and 6, the first insulating film 20 includes the plurality of openings A1 for electrically connecting the n-side contact electrode 41 and the n-side wiring portion 42. For the first insulating film 20, $SiO_2$ or SiN can be used.

The thickness of the first insulating film 20 is, for example, 500 nm or more, and preferably in a range of 500 nm to 1000 nm. The thickness of the first insulating film 20 may be partially varied. For example, the thickness of the first insulating film 20 disposed on the p-side electrode 50 may be different from the thickness of the first insulating film 20 disposed on the n-side contact electrode 41.

5. Second Insulating Film

As illustrated in FIG. 2, the second insulating film 30 is disposed on the semiconductor structure 10. The second insulating film 30 is disposed between the n-side wiring portion 42 and the p-pad electrode 70 and electrically insulates the n-side wiring portion 42 and the p-pad electrode 70 from each other. The second insulating film 30 is disposed between the n-pad electrode 60 and the p-pad electrode 70 and electrically insulates the n-pad electrode 60 and the p-pad electrode 70 from each other. The second insulating film 30 defines the third openings h3 formed at positions each overlapping a respective one of the plurality of second openings h2 of the first insulating film 20.

In a plan view, two or more first openings h1 are formed around a third opening h3, so that a portion in which the n-side wiring portion 42 and the n-side contact electrode 41 are electrically connected and a portion in which the p-side electrode 50 and the p-pad electrode 70 are electrically connected can be located closer to each other. This configuration can shorten a current path between the n-side semiconductor layer 11 and the p-side semiconductor layer 13 and increase a region in which current is likely to concentrate and that has high emission intensity, and thus it is possible to cause the semiconductor structure 10 to emit light more efficiently. In the semiconductor structure 10, increase in exposed portion of the n-side semiconductor layer 11 causes reduction in the area of the light-emitting layer 12. For example, the region in which the n-side semiconductor layer 11 is exposed is increased by increasing the quantity of the plurality of third regions R3 disposed in a plan view. By reducing the distance between the first opening h1 and the third opening h3, it is possible to maintain the light-emitting efficiency of the semiconductor structure 10 even when the area of the light-emitting layer 12 is reduced. There is a case in which the semiconductor structure 10 including the light-emitting layer 12 that emits ultraviolet light uses a semiconductor layer containing Al, and current tends to be difficult to diffuse in the planar direction of the semiconductor structure 10. Thus, the present disclosure is more effective in a case of using the semiconductor structure 10 including the light-emitting layer 12 that emits ultraviolet light.

The quantity of the second openings h2 and the quantity of the third openings h3 are preferably the same. The quantity of second openings h2 may be different from the quantity of third openings h3. In the semiconductor structure 10, when the second insulating film 30 includes the third openings h3, the first insulating film 20 includes the second openings h2 corresponding to the third openings h3. The p-side electrode 50 and the p-pad electrode 70 are electrically connected together through the third openings h3. When the shape of each of the third openings h3 and the second openings h2 is circular in a plan view, the diameter of the third opening h3 may be larger than the diameter of the second opening h2. According to this configuration, when the p-pad electrode 70 and the p-side electrode 50 are electrically connected, the p-pad electrode 70 can be appropriately disposed in the opening where the second openings h2 and the third openings h3 are continuous.

As illustrated in FIGS. 2 and 7, the second insulating film 30 includes the plurality of openings A2 for electrically connecting the n-pad electrode 60 and the n-side wiring portion 42. As the second insulating film 30, $SiO_2$ or SiN can be used. The thickness of the second insulating film 30 is, for example, 500 nm or more, and preferably in a range of 500 nm to 1000 nm. The thickness of the second insulating film 30 may be partially different. For example, the thickness of the second insulating film 30 disposed on the first insulating film 20 may be different from the thickness of the second insulating film 30 disposed on the n-side wiring portion 42.

6. p-Pad Electrode 70

As illustrated in FIG. 2, the p-pad electrode 70 is electrically connected to the p-side electrode 50 through the third opening h3 of the second insulating film 30 and the second opening h2 of the first insulating film 20. As the p-pad electrode 70, the same metal as that of the n-side contact electrode 41 described above can be used. In one example, the p-pad electrode 70 can have a layered structure in which a Ti layer, a Pt layer, and an Au layer are layered in order from the semiconductor structure 10 side. The p-pad electrode 70 has a thickness, for example, in a range of 800 nm to 1000 nm.

The p-pad electrode 70 covers the first region R1 and the third region R3 in a plan view. The p-pad electrode 70 covers at least the light-emitting layer 12 disposed on the first region R1. Thus, heat generated by light emission of the semiconductor structure 10 can be dissipated by the p-pad electrode 70 covering the light-emitting layer 12.

The area of the p-pad electrode 70 is preferably larger than the area of the light-emitting layer 12 in a plan view in view of dissipating the heat generated in the light-emitting layer 12. This configuration allows the heat generated in the light-emitting layer 12 to be efficiently dissipated via the p-pad electrode 70.

The outer edge of the p-pad electrode 70 preferably coincides with the outer edge of the p-side electrode 50 or is positioned outward of the outer edge of the p-side electrode 50, in a cross-sectional view. This configuration allows the heat generated in the light-emitting layer 12 to be efficiently dissipated via the p-side electrode 50 and the p-pad electrode 70.

The p-pad electrode 70 preferably has a substantially octagonal shape in a plan view. This configuration allows the p-pad electrode 70 to be appropriately electrically connected to the p-side electrode 50 disposed in the first region R1. In a plan view, the shape of the p-side electrode 50 is preferably substantially octagonal corresponding to the shape of the p-pad electrode 70.

The semiconductor light-emitting element 1 may further include a bonding member 80. The bonding member 80 is disposed on the n-pad electrode 60 and the p-pad electrode 70. As illustrated in FIG. 2, the bonding member 80 may be disposed on the first region R1. When the bonding member 80 is disposed on the p-pad electrode 70 located above the first opening h1, a load is applied to the second insulating film 30 at the time of bonding, and a crack or the like occurs in the second insulating film 30, so that there is a possibility that the p-pad electrode 70 and the n-side electrode 40 are short-circuited. In order to avoid such short circuit, the bonding member 80 is preferably disposed on the p-pad electrode 70 located above the third opening h3.

7. n-Pad Electrode 60

In a plan view, the n-pad electrode 60 is disposed outward of the outer edge of the p-pad electrode 70 and is electrically connected to the n-side electrode 40. The n-pad electrode 60 is disposed in the second region R2 and is electrically connected to the n-side semiconductor layer 11 via the contact portion 41*p*, the n-side wiring portion 42, and the n-side conductive portion 41*d*. For the n-pad electrode 60, it is preferable to use the same metal as that of the p-pad electrode 70 in view of simplifying the manufacturing process. Different metals may be used for the n-pad electrode 60 and the p-pad electrode 70.

According to the mode of FIG. 1, a plurality of the n-pad electrodes 60 are disposed outward of the outer edge of the p-pad electrode 70 in a plan view. Because the plurality of n-pad electrodes 60 are disposed, the current density to the n-side wiring portion 42 can be dispersed. Thus, it is possible to reduce unevenness of the light emission intensity distribution of the semiconductor light-emitting element 1. The n-pad electrode 60 is disposed in the second region R2 located at a corner portion of the semiconductor structure 10 of the second region R2. By disposing the n-pad electrode 60 at the corner portion of the semiconductor structure 10, it is possible to reduce a decrease in the area of the light-emitting layer 12.

The semiconductor light-emitting element according to the first embodiment of the present disclosure described above includes the plurality of first openings h1 around the third opening h3 in a plan view. In a plan view, a portion in which the n-side semiconductor layer 11 is electrically connected to the n-side contact electrode 41 and the n-side wiring portion 42 via the first opening h1 and a portion in which the p-side semiconductor layer 13 is electrically connected to the p-side electrode 50 via the third opening h3 are arranged with reduced distance between those portions. This configuration can shorten a current path between the n-side semiconductor layer 11 and the p-side semiconductor layer 13 and provide the semiconductor light-emitting element 1 including a region with high light emission intensity around the third opening h3. This configuration can achieve the semiconductor light-emitting element 1 having high light-emitting efficiency. The semiconductor light-emitting element according to the first embodiment of the present disclosure includes the p-pad electrode 70 covering the first region R1 and the third region R3. The p-pad electrode 70 covers the light-emitting layer 12 disposed in the first region R1. This configuration can achieve the semiconductor light-emitting element 1 having improved heat dissipation that can efficiently dissipate, by the p-pad electrode 70, the heat generated by light emission of the light-emitting layer 12.

VARIATION EXAMPLES OF OPENING IN FIRST INSULATING FILM 20 AND/OR SECOND INSULATING FILM 30

Subsequently, Variation Examples of the semiconductor light-emitting element according to the first embodiment of the present disclosure will be described below with reference to FIGS. 8 to 11. Variation Examples of the present disclosure are different from the semiconductor light-emitting element according to the first embodiment described above in the position and/or shape of the opening in the first insulating film 20 and/or the second insulating film 30. Other configurations are basically the same as those of the semiconductor light-emitting element according to the first embodiment of the present disclosure described above. This different configuration will be described below.

Variation Example 1A and Variation Example 1B

Figure 8A:
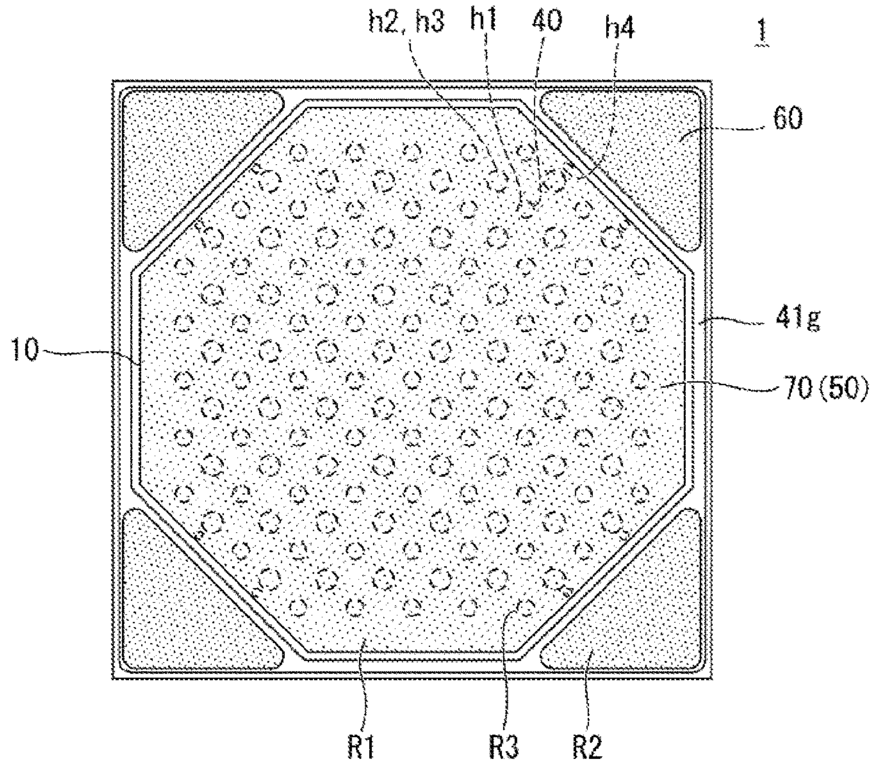
FIG. 8A is a schematic plan view of a semiconductor light-emitting element according to Variation Example 1A of one embodiment.
Figure 8B:
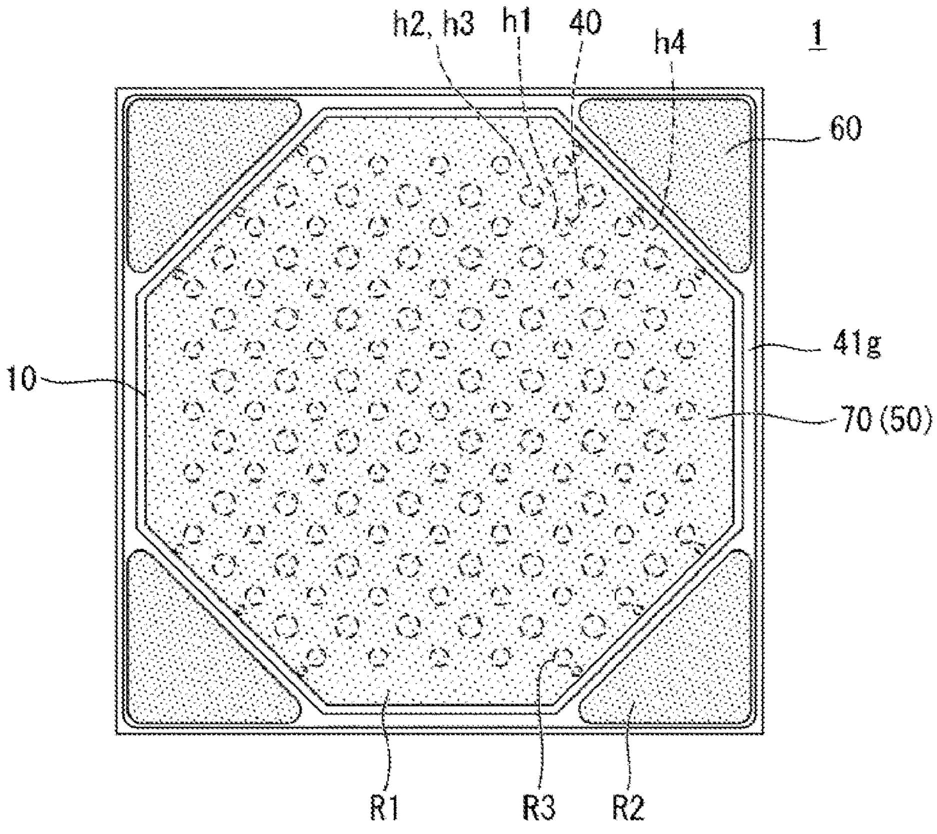
FIG. 8B is a schematic plan view of a semiconductor light-emitting element according to Variation Example 1B of one embodiment.

As illustrated in FIGS. 8A and 8B, the semiconductor light-emitting element 1 according to Variation Example 1A and Variation Example 1B is different from the semiconductor light-emitting element according to the first embodiment described above in that the second insulating film defines at least one fourth opening h4 in addition to the plurality of third openings h3. Similarly to third opening h3, the fourth opening h4 is located at a position overlapping the second opening h2 of the first insulating film 20. In Variation Example 1A illustrated in FIG. 8A, the fourth opening h4 is located between the n-pad electrode 60 and the third opening h3 of the plurality of third openings h3 that is located closest to the n-pad electrode 60 in a plan view. In FIG. 8A of Variation Example 1A, a total of eight fourth openings h4 are formed. Any appropriate quantity of the fourth openings h4 can be formed. Further, in Variation Example 1B illustrated in FIG. 8B, each fourth opening h4 is located between the n-pad electrode 60 and a first opening h1 of the plurality of first openings h1 that is located closest to the n-pad electrode 60 in a plan view. In FIG. 8B, a total of twelve fourth openings h4 are formed. Three respective fourth openings h4 are located between a respective n-pad electrode 60 and first openings h1 of the plurality of first openings h1 located closest to the respective n-pad electrode 60, each fourth opening h4 located between the respective n-pad electrode 60 and a respective one of the first openings h1 located closest to the respective n-pad electrode 60. In Variation Example 1A and Variation Example 1B, the fourth opening h4 where the p-pad electrode 70 and the p-side semiconductor layer 13 are electrically connected is disposed between the n-pad electrode 60 and the first opening h1 that is located closest to the n-pad electrode 60.

Thus, it is possible to shorten the current path from the p-side semiconductor layer 13 to the n-side semiconductor layer 11 and increase a region in which current is concentrated and light emission intensity is high. In FIG. 8A and FIG. 8B, each of the fourth openings h4 is located between a corresponding n-pad electrode 60 of all the n-pad electrodes 60 and a corresponding first or third opening h1 or h3 located closest to the corresponding n-pad electrode 60, but is not limited thereto. The at least one fourth opening h4 can be located between at least one of the n-pad electrodes 60 and first or third opening h1 or h3 located closest to the at least one n-pad electrode 60. In a plan view, the size of the fourth opening h4 is smaller than both the size of the third opening h3 and the size of the second opening h2. The size of the fourth opening h4 may be the same as or larger than the size of the third opening h3 and/or the size of the second opening h2.

Variation Example 2

Figure 9:
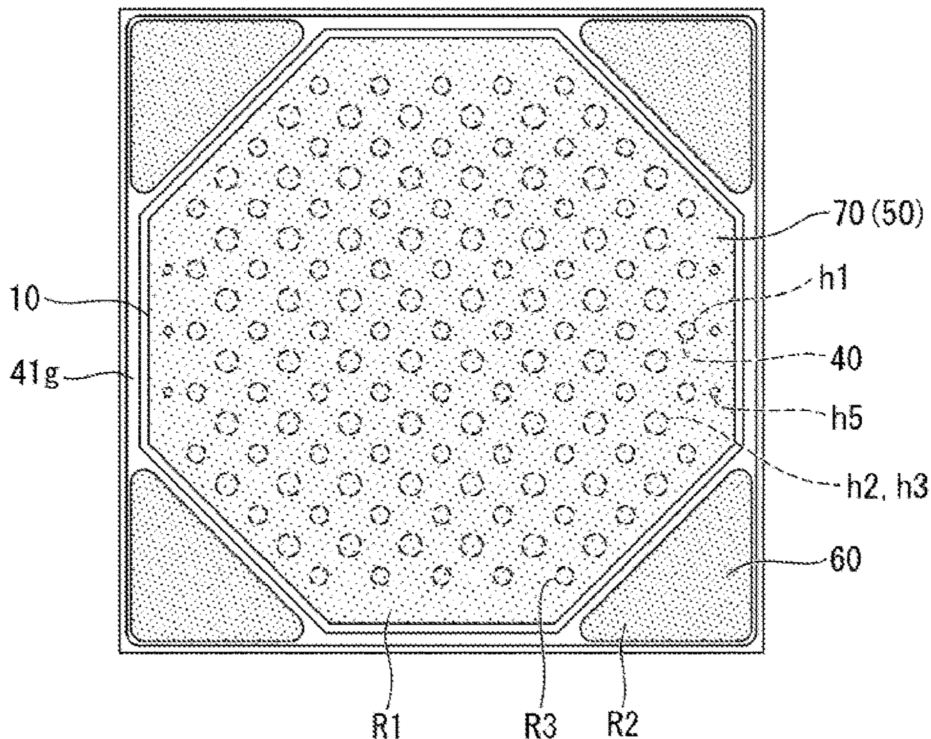
FIG. 9 is a schematic plan view of a semiconductor light-emitting element according to Variation Example 2 of one embodiment.

As illustrated in FIG. 9, the semiconductor light-emitting element 1 according to Variation Example 2 is different from the semiconductor light-emitting element according to the first embodiment described above in that the second insulating film 30 defines a plurality of fifth openings h5 in addition to the plurality of third openings h3. Similarly to third opening h3, the fifth opening h5 is located at a position overlapping the second opening h2 of the first insulating film 20. The fifth opening h5 is located between the first opening h1 among the plurality of first openings h1 located closest to the n-side outer-peripheral conductive portion 41*g* and the n-side outer-peripheral conductive portion 41*g* in a plan view. With this configuration, the fifth opening h5 where the p-pad electrode 70 and the p-side semiconductor layer 13 are electrically connected is disposed between the first opening h1 located closest to the n-side outer-peripheral conductive portion 41*g* and the n-side outer-peripheral conductive portion 41*g*. Thus, it is possible to shorten the current path from the p-side semiconductor layer 13 to the n-side semiconductor layer 11 and increase a region in which current is concentrated and light emission intensity is high. As illustrated in FIG. 9, in a plan view, the size of the fifth opening h5 is smaller than the size of the third opening h3 or the size of the second opening h2. The size of the fifth opening h5 may be the same as or larger than the size of the third opening h3 or the size of the second opening h2. In FIG. 9, in a plan view, three fifth openings h5 are each disposed between the first opening h1 among the plurality of first openings h1 located closest to the n-side outer-peripheral conductive portion 41*g* and the n-side outer-peripheral conductive portion 41*g*. Any appropriate quantity of the fifth openings h5 may be formed. In FIG. 9, the fifth openings h5 are located between all the n-side outer-peripheral conductive portions 41*g* and first openings h1 of the plurality of first openings h1 located closest to respective n-side outer-peripheral conductive portions 41*g*, but is not particularly limited thereto. The fifth opening h5 is located between at least one of the n-side outer-peripheral conductive portions 41*g* and the first opening h1 located closest to the one n-side outer-peripheral conductive portion 41*g*.

Variation Example 3

Figure 10:
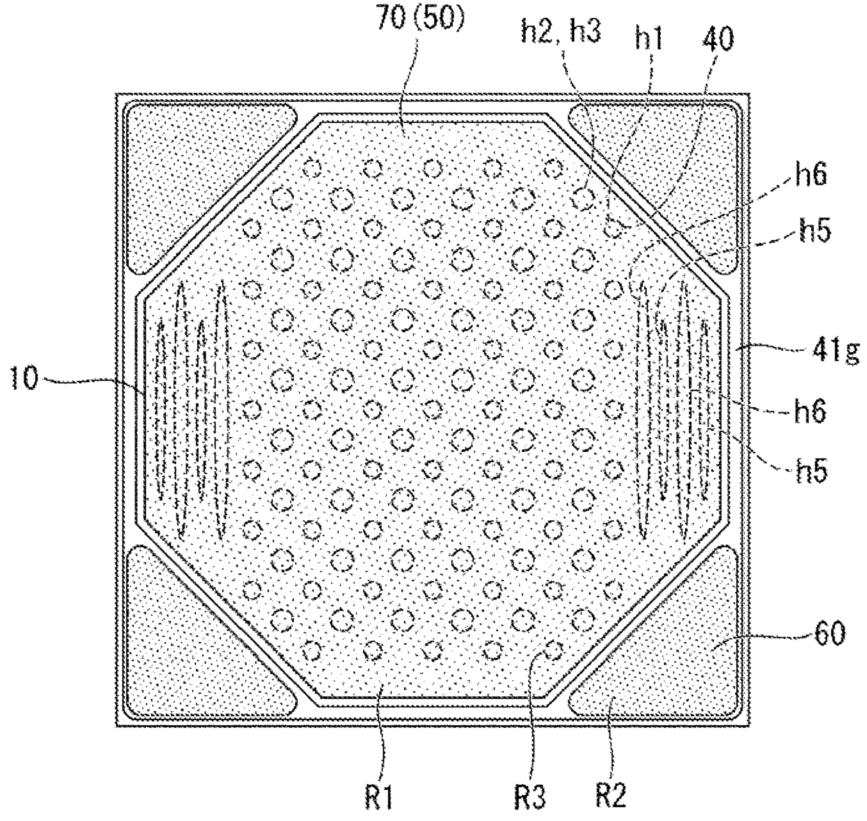
FIG. 10 is a schematic plan view of a semiconductor light-emitting element according to Variation Example 3 of one embodiment.

As illustrated in FIG. 10, the semiconductor light-emitting element 1 according to Variation Example 3 is different from the semiconductor light-emitting element according to Variation Example 2 described above in that the first insulating film 20 defines sixth openings h6 in addition to the plurality of first openings h1, each sixth opening h6 having the area larger than the area of a single first opening h1 in a plan view. The sixth opening h6 has an elliptical shape in a plan view. This configuration can increase the contact area between the n-side semiconductor layer 11 and the n-side electrode 40, so that rise in the forward voltage can be reduced. In a plan view, the fifth opening h5 is located between the sixth opening h6 and the n-side outer-peripheral conductive portion 41*g*.

This configuration can shorten the current path from the p-side semiconductor layer 13 to the n-side semiconductor layer 11 and increase a region in which light emission intensity is high.

Furthermore, in the semiconductor light-emitting element 1 according to Variation Example 3, the area of the fifth opening h5 is larger than the area of one third opening h3 in a plan view, and the fifth opening h5 has an elliptical shape in a plan view.

This configuration can increase the contact area between the p-side electrode 50 and the p-side semiconductor layer 13, so that rise in the forward voltage can be reduced. In a plan view, the elliptical fifth opening h5 and the elliptical sixth opening h6 are alternately disposed. In FIG. 10, two fifth openings h5 having an elliptical shape in a plan view and two sixth openings h6 having an elliptical shape in a plan view are alternately disposed. The fifth opening h5 has an elliptical shape elongated in the direction in which the plurality of third openings h3 are arrayed. The sixth opening h6 has an elliptical shape elongated in the direction in which the plurality of first openings h1 are arrayed.

Variation Example 4

Figure 11:
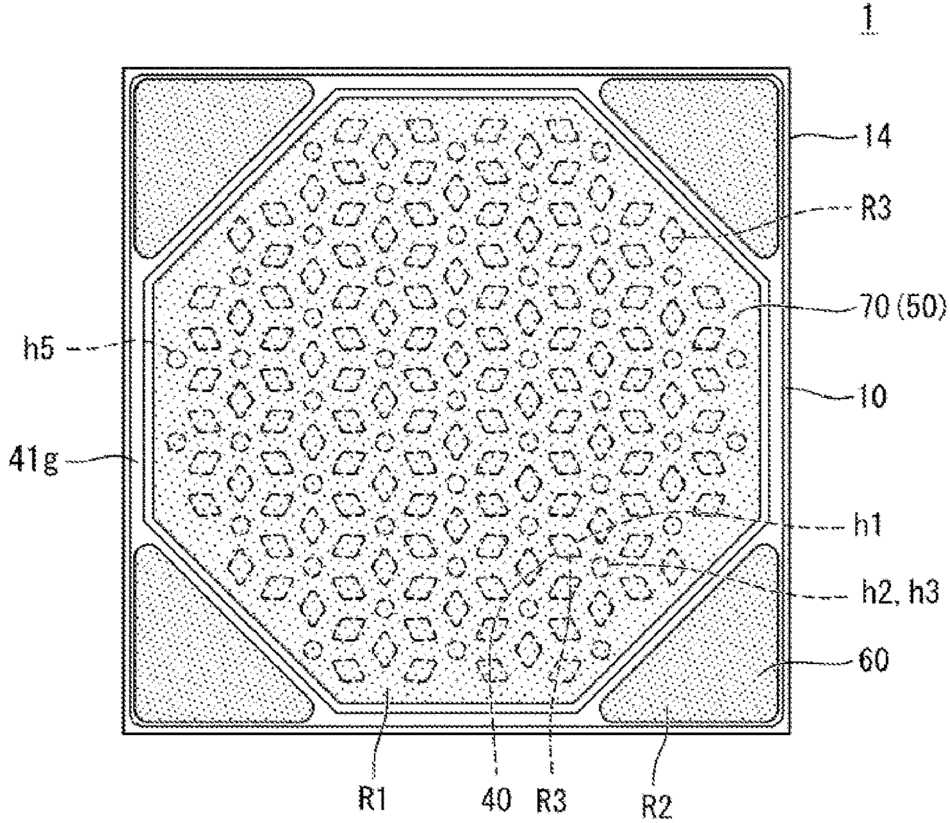
FIG. 11 is a schematic plan view of a semiconductor light-emitting element according to Variation Example 4 of one embodiment.

As illustrated in FIG. 11, the semiconductor light-emitting element 1 according to Variation Example 4 is different from the semiconductor light-emitting element 1 according to the above-described first embodiment in (1) the shape of the plurality of first openings h1 and (2) the positional relationship between the plurality of first openings h1 and the plurality of third openings h3.

The shape of the first opening h1 is, for example, a parallelogram in a plan view. In a case in which the shape of the first opening h1 is a parallelogram, it is preferable to dispose the first opening h1 such that the distance between the corner portion of the parallelogram and the third opening h3 is shortened in a plan view.

Such shape and disposition allow the first openings h1 to be formed at a high density so as to fill the gap between the adjacent third openings h3. The shape of the first opening h1 in a plan view may be rectangular.

The first openings h1 are formed such that at least one side forming the outer shape of the first opening h1 is parallel to at least one side forming the outer shape of the adjacent first opening h1.

This configuration allows the first openings h1 to be formed at a high density so as to fill the gap between the adjacent third openings h3. In a plan view, the area of the outer shape of the first opening h1 is larger than the area of the outer shape of the third opening h3.

This configuration can increase the area of the n-side electrode 40 and increase the quantity of places in which the distance between the n-side semiconductor layer 11 and the p-side semiconductor layer 13 is small.

As illustrated in FIG. 11, the plurality of first openings h1 and the plurality of third openings h3 are alternately disposed on a line parallel to one side of the substrate 14.

In a plan view, six first openings h1 are formed around one third opening h3. With this configuration, electrons supplied from the n-side electrode 40 via a first opening h1 can be radially moved toward second openings h2 located around the first opening h1, and thus the light-emitting efficiency can be further improved.

In view of reducing unevenness of the current density distribution around the third opening h3, it is preferable that the distances between the center of the third opening h3 and the center of the six first openings h1 formed around one third opening h3 are equal to one another.

In Variation Example 4, the second insulating film 30 may further define fifth openings h5 as in Variation Example 2, in addition to the plurality of third openings h3 in the second insulating film 30 and the plurality of second opening h2 in the first insulating film 20.

Variation Example of Configuration Related to Pad Electrode

Another Variation Example of the semiconductor light-emitting element according to the first embodiment of the present disclosure will be described below with reference to FIG. 12. Variation Example of the present disclosure is different from the semiconductor light-emitting element according to the first embodiment described above in the configuration regarding the n-pad electrode 60 and the p-pad electrode 70. Other configurations are basically the same as those of the semiconductor light-emitting element according to the first embodiment of the present disclosure described above. This different configuration will be described below.

Variation Example 5

Figure 12:
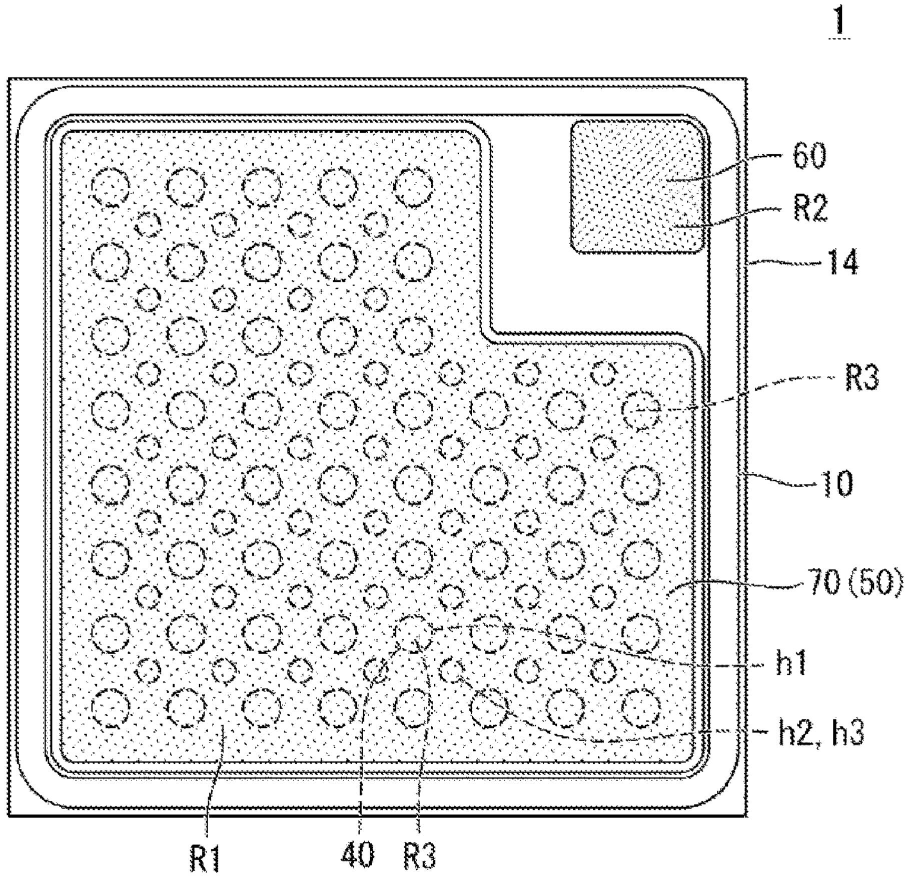
FIG. 12 is a schematic plan view of a semiconductor light-emitting element according to Variation Example 5 of one embodiment.

As illustrated in FIG. 12, the semiconductor light-emitting element 1 according to Variation Example 5, the n-pad electrode 60 is disposed at one corner portion of the four corner portions of the semiconductor light-emitting element 1 in a plan view. The p-pad electrode 70 is disposed so as to cover corner portions of the semiconductor light-emitting element 1 except for the corner portion where the n-pad electrode 60 is disposed in a plan view. As can be grasped from FIG. 12, the area of the p-pad electrode 70 is larger than the area of the n-pad electrode 60 in a plan view.

The second region R2 in which the n-pad electrode 60 is disposed is located at the corner portion of the semiconductor light-emitting element 1. The first region R1 is located in a region excluding the second region R2 and the third regions R3. Also in the semiconductor light-emitting element 1 according to Variation Example 5, the second region R2 is located on the outer periphery (or outside) of the first region R1. The p-pad electrode 70 covers the light-emitting layer 12 disposed in the first region R1. This configuration can achieve the semiconductor light-emitting element 1 having improved heat dissipation that can efficiently dissipate, by the p-pad electrode 70, the heat generated by light emission of the light-emitting layer 12.

In the semiconductor light-emitting element 1 according to Variation Example 5 illustrated in FIG. 12, the n-pad electrode 60 is disposed at the corner portion of the semiconductor structure 10, but the n-pad electrode 60 may be disposed at the center of a side constituting an outer edge of the semiconductor light-emitting element 1 in a plan view. In this case, the outer shape of the p-pad electrode 70 may be a C-shape (or a U-shape) surrounding the n-pad electrode 60 in a plan view.

Figure 13:
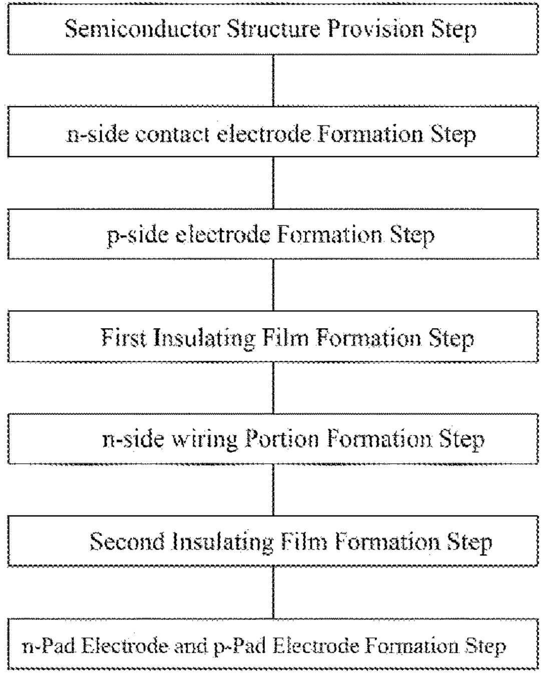
FIG. 13 is a flowchart illustrating a manufacturing flow of the semiconductor light-emitting element of the embodiment according to the present disclosure.

Subsequently, a manufacturing method for the semiconductor light-emitting element of the present disclosure will be described with reference to the manufacturing flowchart of FIG. 13 and the like.

1. Semiconductor Structure Provision Step

The semiconductor structure provision step is a step of providing a semiconductor structure 10. For example, the semiconductor structure 10 is provided by forming an n-side semiconductor layer 11, a light-emitting layer 12, and a p-side semiconductor layer 13 in this order on a substrate 14. As a method of forming the semiconductor structure 10, for example, a known method such as an MOCVD method is adopted. Thereafter, with respect to the semiconductor structure 10, a part of the n-side semiconductor layer 11 is exposed from the light-emitting layer 12 and the p-side semiconductor layer 13 in a third region R3, as described in "the semiconductor light-emitting element of the first embodiment." As a method of exposing the n-side semiconductor layer 11, for example, a known etching technique can be adopted.

2. n-Side Contact Electrode Formation Step

The n-side contact electrode formation step is a step of forming an n-side contact electrode 41 at a position in which the n-side semiconductor layer 11 is exposed. A known electrode formation technique can be adopted to form the n-side contact electrode 41. Examples of the method for forming the n-side contact electrode 41 include a sputtering method and a vapor deposition method. The n-side contact electrode formation step includes forming the n-side contact electrode 41 including a contact portion 41*p*, an n-side outer-peripheral conductive portion 41*g*, and an n-side conductive portion 41*d*. The n-side contact electrode formation step may include forming an insulating film on the outermost surface of the n-side contact electrode 41. The insulating film formed on the outermost surface of the n-side contact electrode 41 can be removed in a step of forming a first opening h1 and a second opening h2 on a first insulating film 20 in a first insulating film formation step described below.

3. p-Side Electrode Formation Step

The p-side electrode formation step is a step of forming a p-side electrode 50 on the A-side semiconductor layer 13 of the semiconductor structure 10. A known electrode formation technique can be adopted to form the p-side electrode 50. Examples of the method for forming the p-side electrode 50 include a sputtering method and a vapor deposition method. The p-side electrode formation step can include forming the p-side electrode 50 on the p-side semiconductor layer 13 in a first region R1. As illustrated in FIG. 3, the p-side electrode 50 includes a plurality of circular openings in a plan view. The contact portion 41*p* of the n-side contact electrode 41 is exposed in the opening of the p-side electrode 50.

4. First Insulating Film Formation Step

The first insulating film formation step is a step of forming the first insulating film 20 defining the first opening h1 and the second opening h2 respectively above the n-side contact electrode 41 and the p-side electrode 50 described above. A known insulating film formation technique can be adopted to form the first insulating film 20. Examples of the method for forming the first insulating film 20 include a sputtering method, a vapor deposition method, and a chemical vapor deposition method.

The first insulating film formation step includes disposing the first insulating film 20 on the n-side contact electrode 41 and the p-side electrode 50, and forming the first opening h1, an opening A1, and the second opening h2 in the first insulating film 20. The first opening h1 and the opening A1 are formed for electrical connection with an n-side wiring portion 42. The second opening h2 is formed for electrical connection with a p-pad electrode 70. The first opening h1 and the second opening h2 can be formed by forming a resist mask on the first insulating film 20 and then removing a part of the first insulating film 20 through the resist mask. For example, the resist mask may be formed at positions corresponding to the first opening h1 and the second opening h2 on the first insulating film 20. A known etching technique can be adopted to remove the first insulating film 20. Examples of the method for removing the first insulating film 20 include wet etching and dry etching.

5. n-Side Wiring Portion Formation Step

The n-side wiring portion formation step is a step of forming the n-side wiring portion 42 on the first insulating film 20 described above. A known electrode formation technique can be adopted to form the n-side wiring portion 42. Examples of the method for forming the n-side wiring portion 42 include a sputtering method and a vapor deposition method. As illustrated in FIG. 5, the n-side wiring portion 42 includes a plurality of circular openings in a plan view. The p-side electrode 50 is exposed in the opening of the n-side wiring portion 42. In the n-side wiring portion formation step, an insulating film may be formed on the outermost surface of the n-side wiring portion 42. The insulating film formed on the outermost surface of the n-side wiring portion 42 can be removed in a step of forming a third opening h3 in a second insulating film 30 in a second insulating film formation step described below.

6. Second Insulating Film Formation Step

The second insulating film formation step is a step of forming the second insulating film 30 including the third opening h3 on the n-side wiring portion 42 described above. The third opening h3 may be formed at a position overlapping the second opening h2 in a plan view. A known insulating film formation technique can be adopted to form the second insulating film 30. Examples include a sputtering method, a vapor deposition method, and a chemical vapor deposition method. The second insulating film 30 may be made of the same type of material as that of the first insulating film 20 or may be made of different types of materials.

The second insulating film formation step includes a step of forming the second insulating film 30 on the n-side wiring portion 42, and a step of forming, in the second insulating film 30, the third opening h3 for electrically connecting the p-pad electrode 70 and the p-side semiconductor layer 13. The third opening h3 can be formed by forming a resist mask on the second insulating film 30 and then removing a part of the second insulating film 30 through the resist mask. For example, the resist mask may be formed at a position corresponding to the second opening h2 on the second insulating film 30. A known etching technique can be adopted to remove the second insulating film 30. Examples of the method for removing the second insulating film 30 include wet etching and dry etching.

A step of exposing the substrate 14 from the semiconductor structure 10 at the outer edge of the semiconductor light-emitting element 1 may be included before the second insulating film formation step is performed. The outer edge of the semiconductor light-emitting element 1 is located outward of the opening Al in a plan view. By performing the step of exposing the substrate 14 from the semiconductor structure 10, a part of the lateral surface of the n-side semiconductor layer 11, a part of the lateral surface of the first insulating film 20, and a part of the lateral surface of the n-side wiring portion 42 are exposed. In the second insulating film formation step, the second insulating film 30 may be formed on the exposed substrate 14. As illustrated in FIG. 2, the exposed part of the lateral surface of the n-side semiconductor layer 11, the exposed part of the lateral surface of the first insulating film 20, and the exposed part of the lateral surface of the n-side wiring portion 42 can be covered with the second insulating film 30.

7. n-Pad Electrode and p-Pad Electrode Formation Step

The n-pad electrode and p-pad electrode formation step is a step of forming an n-pad electrode 60 electrically connected to the n-side wiring portion 42 and the p-pad electrode 70 electrically connected to the p-side electrode 50. A known electrode formation technique can be adopted to form the n-pad electrode 60 and the p-pad electrode 70. Examples of the method for forming the n-pad electrode 60 and the p-pad electrode 70 include a sputtering method and a vapor deposition method. It is possible to simultaneously form the n-pad electrode 60 and the p-pad electrode 70 made of the same metal material. The n-pad electrode 60 and the p-pad electrode 70 may be formed using different metal materials in different steps.

A step of cleaving the substrate 14 may be included after the n-pad electrode and p-pad electrode formation step. The step of cleaving the substrate 14 is a step of singulating the plurality of semiconductor light-emitting elements 1 formed on the substrate 14 into a plurality of semiconductor light-emitting elements 1, each including the substrate 14. Examples of the method for cleaving the substrate 14 include laser light irradiation and dicing with a blade.

According to the manufacturing method for the semiconductor light-emitting element of the present disclosure, as described in "the semiconductor light-emitting element of the first embodiment," it is possible to manufacture a semiconductor light-emitting element with improved light-emitting efficiency and heat dissipation.

Description of First Verification Test

A first verification test was conducted regarding the semiconductor light-emitting element of the present disclosure. Specifically, semiconductor light-emitting elements of Comparative Example and Examples described below were manufactured.

EXAMPLES

First, a structure common to the basic structures of the semiconductor light-emitting elements of Examples 1 to 7 will be described.

Common Structure of Semiconductor Light-Emitting Elements of Examples 1 to 7

Semiconductor light-emitting elements 1A to 1G of Examples 1 to 7, respectively illustrated in FIGS. 14A to 14G basically had the same basic structure as that of the first embodiment illustrated in FIGS. 1 to 7 described above. The semiconductor light-emitting elements 1A to 1G of Examples 1 to 7, respectively each included a semiconductor structure 10, an n-side electrode 40, an n-pad electrode 60, a first insulating film 20, a second insulating film 30, a p-side electrode 50, and a p-pad electrode 70 on a substrate 14. Hereinafter, the structure common to the semiconductor light-emitting elements 1A to 1G of Examples 1 to 7, respectively will be described in detail. As the substrate 14, a sapphire substrate was used. The substrate 14 was a square having a side of 1 mm in a plan view. As the semiconductor structure 10, a nitride semiconductor in which an n-type semiconductor layer including an AlGaN layer having an Al composition ratio of 60% and a p-type semiconductor layer including an AlGaN layer having an Al composition ratio of 20% were layered was used. As an n-side contact electrode 41 of the n-side electrode 40, a layered structure in which a Ti layer having a thickness of 25 nm, an Al alloy layer having a thickness of 100 nm, a Ta layer having a thickness of 500 nm, an Ru layer having a thickness of 120 nm, and a Ti layer having a thickness of 120 nm were layered in order was used. As an n-side wiring portion 42, a layered structure in which a Ti layer having a thickness of 1.5 nm, an Rh layer having a thickness of 500 nm, and a Ti layer having a thickness of 10 nm were layered in order was used. As the first insulating film 20, a $SiO_2$ layer having a thickness of 800 nm was used. As the p-side electrode 50, a layered structure in which an Rh layer having a thickness of 100 nm, an Ni layer having a thickness of 6 nm, and an Au layer having a thickness of 7 nm were layered in order was used. As the second insulating film 30, a $SiO_2$ layer having a thickness of 800 nm was used. As the n-pad electrode 60 and the p-pad electrode 70, a layered structure in which a Ti layer having a thickness of 200 nm, a Pt layer having a thickness of 200 nm, and an Au layer having a thickness of 500 nm were layered in order was used.

In the semiconductor light-emitting elements 1A to 1G of Examples 1 to 7, respectively, the outer shape of the first region R1 was octagonal in a plan view. The area of the outer shape of the first region R1 was 670957 $\mu m^2$. The outer shape of the p-pad electrode 70 was octagonal in a plan view. The n-pad electrode 60 was disposed at each of the four corners of the substrate 14 located outward of the outer edge of the p-pad electrode 70. The semiconductor light-emitting elements 1A to 1G of Examples 1 to 7, respectively had contact portions 41*p* having a common size and n-side outer-peripheral conductive portions 41*g*. In the semiconductor light-emitting elements 1A to 1G of Examples 1 to 7, respectively, the total area of the contact portion 41*p* and the n-side outer-peripheral conductive portion 41*g* was 210024 $\mu m^2$. In the semiconductor light-emitting elements 1A to 1G of Examples 1 to 7, respectively, the outer shape of the n-side conductive portion 41*d* was circular in a plan view. One n-side conductive portion 41*d* had a diameter of 20 μm and an area of 314 $\mu m^2$.

Subsequently, different points of the semiconductor light-emitting elements 1A to 1G of Examples 1 to 7, respectively will be described in detail. The semiconductor light-emitting elements 1A to 1G of Examples 1 to 7, respectively have individually different total areas of the n-side contact electrodes 41 and different total areas of the light-emitting layers 12. The more the total area of the n-side contact electrode 41 increases, the more the total area of the light-emitting layer 12 decreases. The semiconductor light-emitting elements 1A to 1G of Examples 1 to 7, respectively have individually different total areas of the n-side conductive portions 41*d*.

Semiconductor Light-Emitting Element 1A of Example 1: See FIG. 14A

In the semiconductor light-emitting element 1A of Example 1, the quantity of n-side conductive portions 41*d* was 156. The quantity of the first openings h1 for disposing the n-side conductive portion 41*d* was 156.

In the semiconductor light-emitting element 1A of Example 1, the quantity of the second openings h2 and the third openings h3 for achieving conduction of the p-side electrode 50 with the p-pad electrode 70 was 145. The diameter of the third opening h3 of the semiconductor light-emitting element 1A was 12 μm.

In the semiconductor light-emitting element 1A of Example 1, the area of the n-side contact electrode 41 was 259008 $\mu m^2$. As illustrated in FIG. 4, in the present description, the expression "area of the n-side contact electrode" is an area in a plan view in which the area of the contact portion 41*p*, the area of the n-side outer-peripheral conductive portion 41*g*, and the area of the n-side conductive portion 41*d* are added.

Figure 14A:
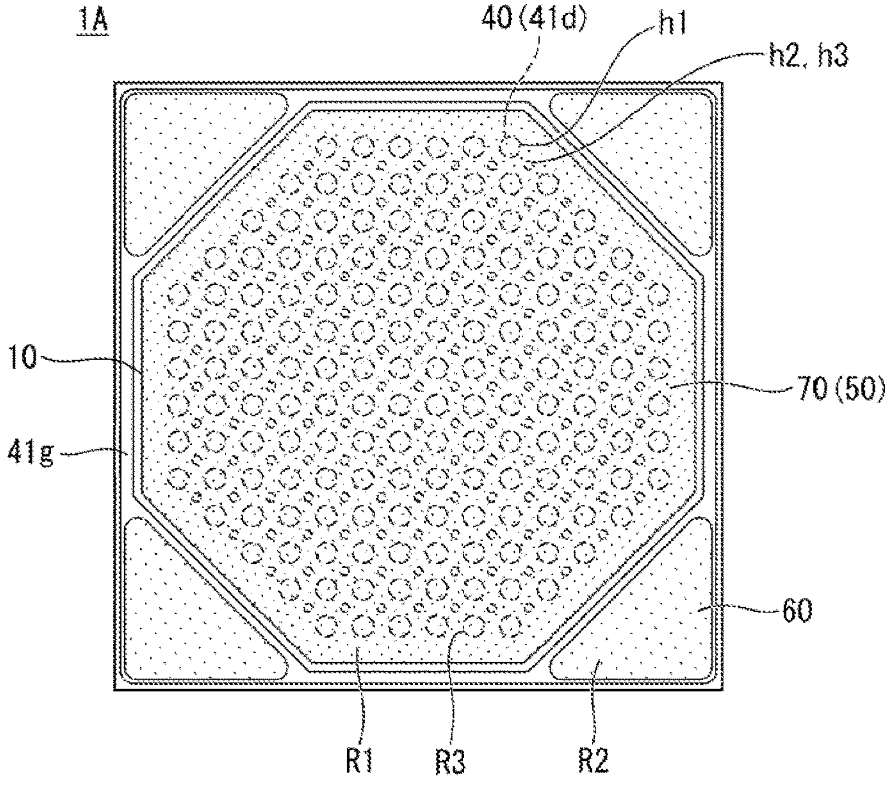
FIG. 14A is a schematic plan view of a semiconductor light-emitting element according to Example 1 used in a first verification test and a second verification test.
Figure 14B:
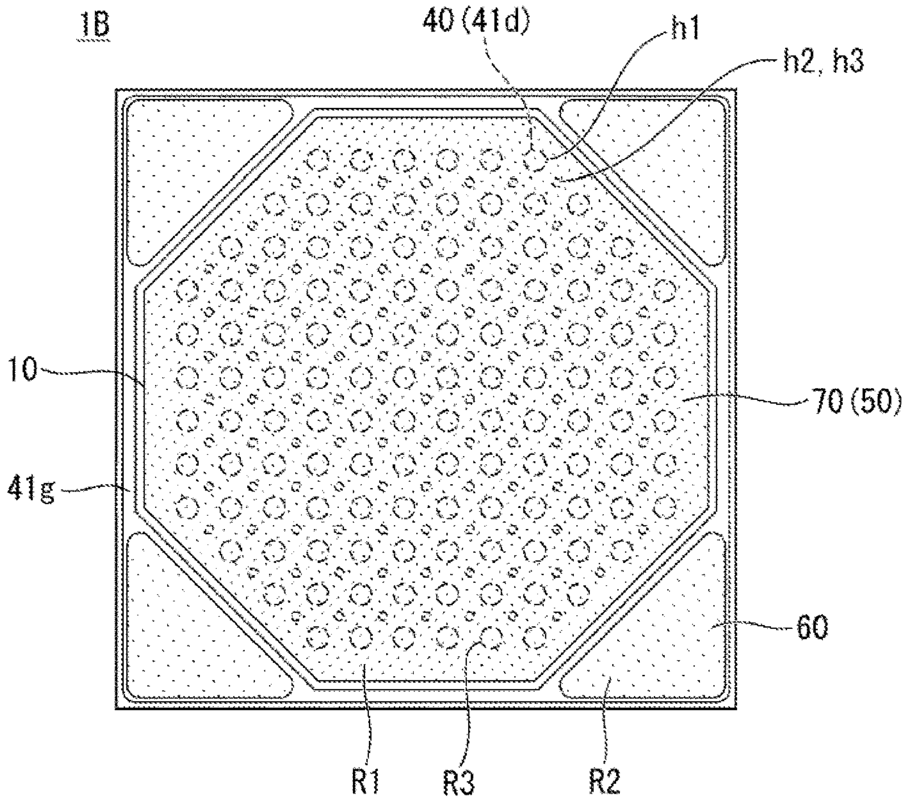
FIG. 14B is a schematic plan view of a semiconductor light-emitting element according to Example 2 used in the first verification test and the second verification test.
Figure 14C:
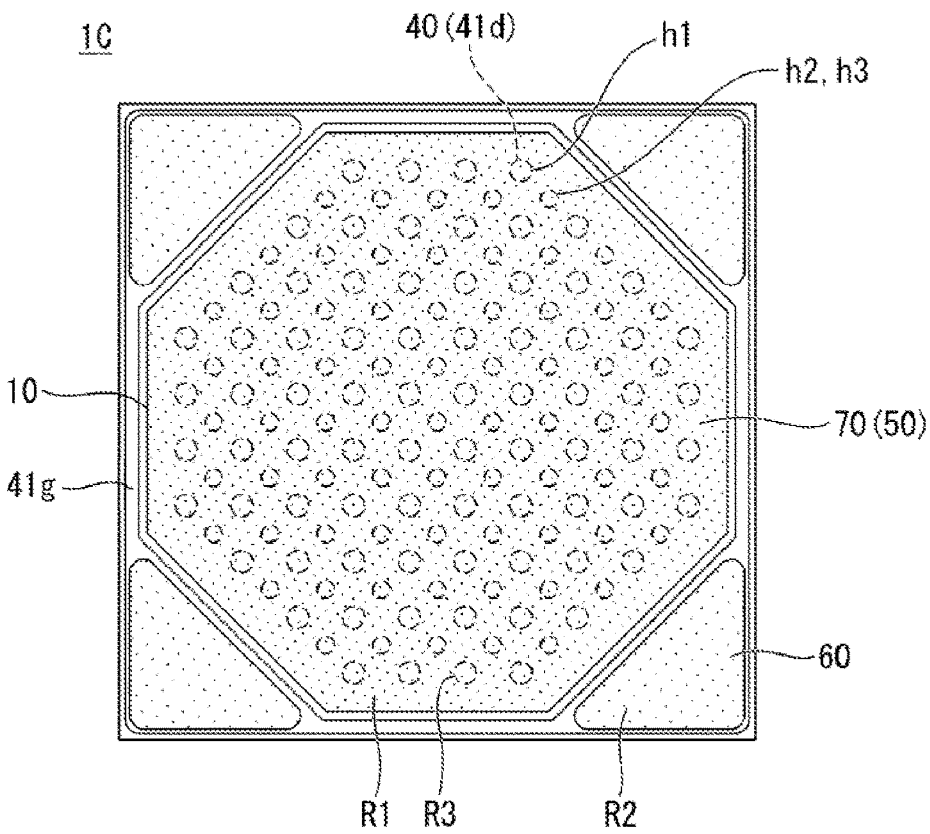
FIG. 14C is a schematic plan view of a semiconductor light-emitting element according to Example 3 used in the first verification test and the second verification test.
Figure 14D:
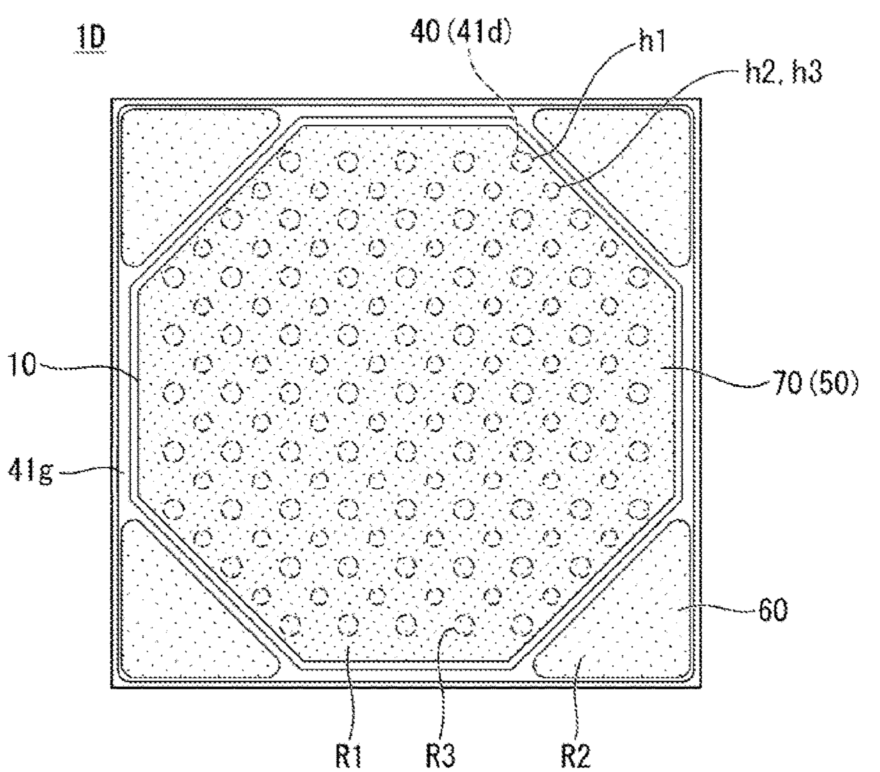
FIG. 14D is a schematic plan view of a semiconductor light-emitting element according to Example 4 used in the first verification test and the second verification test.
Figure 14E:
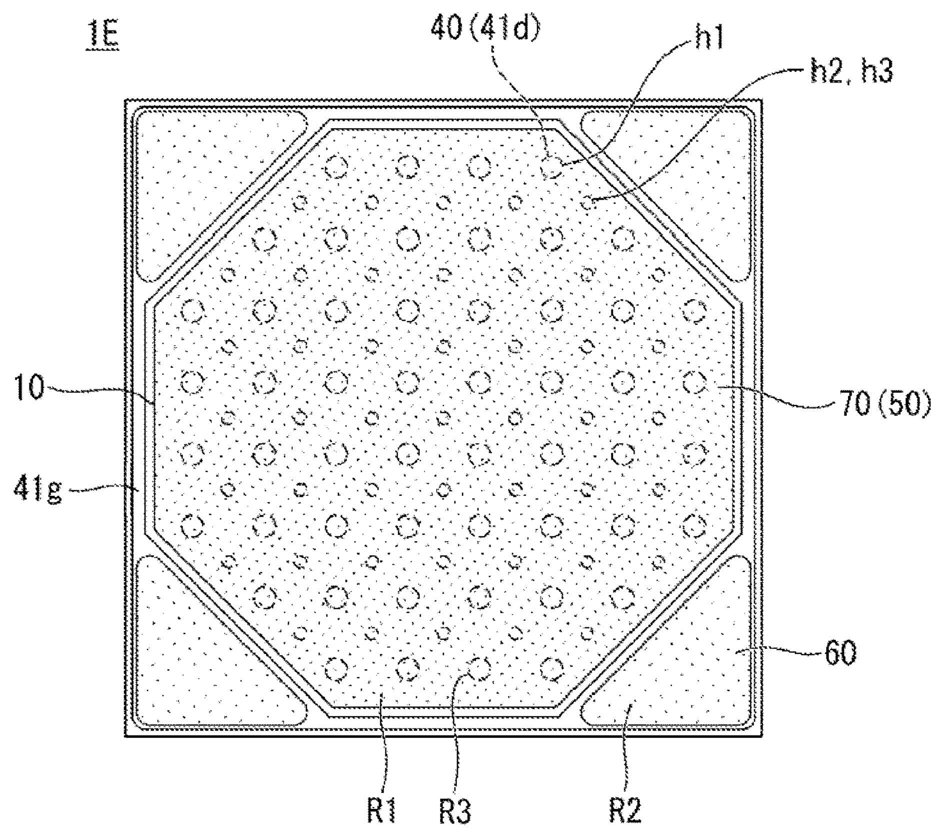
FIG. 14E is a schematic plan view of a semiconductor light-emitting element according to Example 5 used in the first verification test.
Figure 14F:
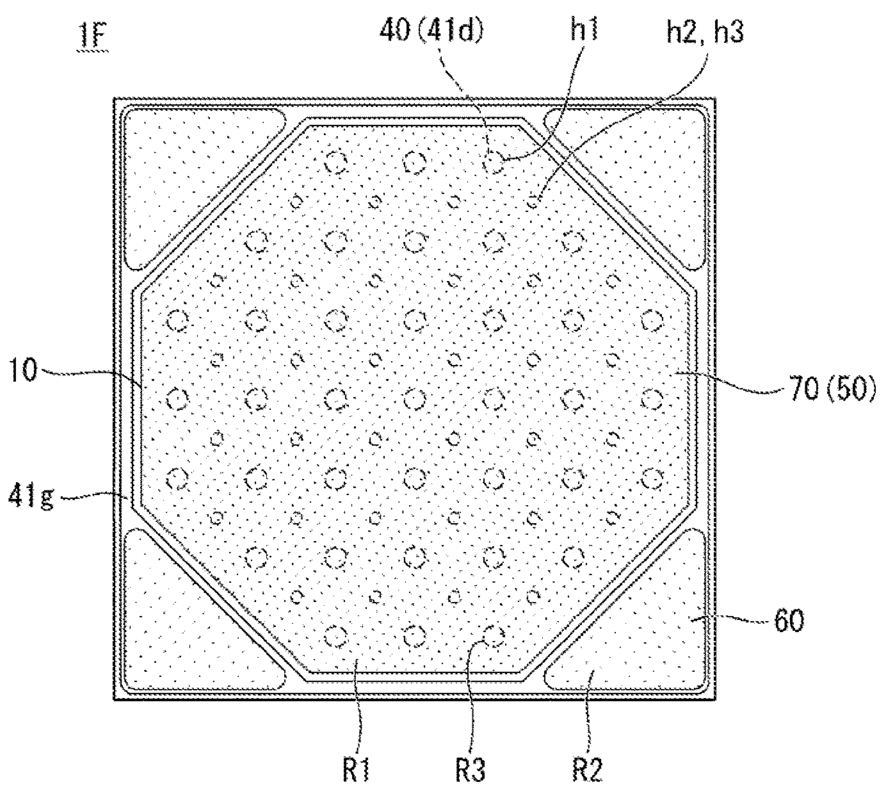
FIG. 14F is a schematic plan view of a semiconductor light-emitting element according to Example 6 used in the first verification test.
Figure 14G:
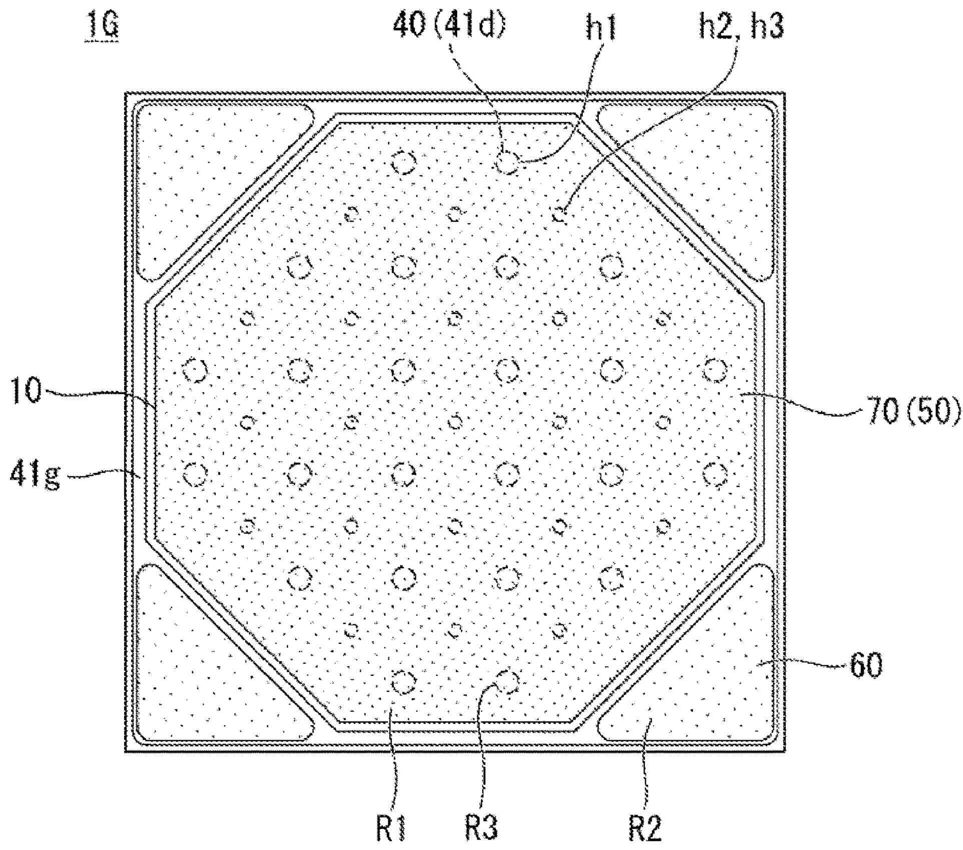
FIG. 14G is a schematic plan view of a semiconductor light-emitting element according to Example 7 used in the first verification test.

In the semiconductor light-emitting element 1A of Example 1, the area of the light-emitting layer 12 was 529465 $\mu m^2$. The expression "area of the light-emitting layer" mentioned in the present description is an area of the light-emitting layer 12 in a plan view as illustrated in FIGS. 2 and 14A.

Semiconductor Light-Emitting Element 1B of Example 2: See FIG. 14B

In the semiconductor light-emitting element 1B of Example 2, the quantity of n-side conductive portions 41*d* was 120. The quantity of the first openings h1 for disposing the n-side conductive portion 41*d* was 120.

In the semiconductor light-emitting element 1B of Example 2, the quantity of the second openings h2 (or the third openings h3) for achieving conduction of the p-side electrode 50 with the p-pad electrode 70 was 109. In a plan view, the diameter of the third opening h3 of the semiconductor light-emitting element 1B was 12 μm.

In the semiconductor light-emitting element 1B of Example 2, the area of the n-side contact electrode 41 was 247704 $\mu m^2$. In the semiconductor light-emitting element 1B of Example 2, the area of the light-emitting layer 12 was 562117 $\mu m^2$.

Semiconductor Light-Emitting Element 1C of Example 3: See FIG. 14C

In the semiconductor light-emitting element 1C of Example 3, the quantity of n-side conductive portions 41*d* was 76. The quantity of the first openings h1 for disposing the n-side conductive portion 41*d* was 76.

In the semiconductor light-emitting element 1C of Example 3, the quantity of the second openings h2 and the third openings h3 for achieving conduction of the p-side electrode 50 with the p-pad electrode 70 was 69. In a plan view, the diameter of the third opening h3 of the semiconductor light-emitting element 1C was 32 μm.

In the semiconductor light-emitting element 1C of Example 3, the area of the n-side contact electrode 41 was 233888 $\mu m^2$. In the semiconductor light-emitting element 1C of Example 3, the area of the light-emitting layer 12 was 602025 $\mu m^2$.

Semiconductor Light-Emitting Element 1D of Example 4: See FIG. 14D

In the semiconductor light-emitting element 1D of Example 4, the quantity of n-side conductive portions 41*d* was 69. The quantity of the first openings h1 for disposing the n-side conductive portion 41*d* was 69.

In the semiconductor light-emitting element 1D of Example 4, the quantity of the second openings h2 and the third openings h3 for achieving conduction of the p-side electrode 50 with the p-pad electrode 70 was 60. In a plan view, the diameter of the third opening h3 of the semiconductor light-emitting element 1D was 32 μm.

In the semiconductor light-emitting element 1D of Example 4, the area of the n-side contact electrode 41 was 231690 $\mu m^2$. In the semiconductor light-emitting element 1D of Example 4, the area of the light-emitting layer 12 was 608374 $\mu m^2$.

Semiconductor Light-Emitting Element 1E of Example 5: See FIG. 14E

In the semiconductor light-emitting element 1E of Example 5, the quantity of n-side conductive portions 41*d* was 52. The quantity of the first openings h1 for disposing the n-side conductive portion 41*d* was 52.

In the semiconductor light-emitting element 1E of Example 5, the quantity of the second openings h2 and the third openings h3 for achieving conduction of the p-side electrode 50 with the p-pad electrode 70 was 45. In a plan view, the diameter of the third opening h3 of the semiconductor light-emitting element 1E was 32 μm.

In the semiconductor light-emitting element 1E of Example 5, the area of the n-side contact electrode 41 was 226352 $\mu m^2$. In the semiconductor light-emitting element 1E of Example 5, the area of the light-emitting layer 12 was 623793 $\mu m^2$.

Semiconductor Light-Emitting Element 1F of Example 6: See FIG. 14F

In the semiconductor light-emitting element 1F of Example 6, the quantity of n-side conductive portions 41*d* was 37. The quantity of the first openings h1 for disposing the n-side conductive portion 41*d* was 37.

In the semiconductor light-emitting element 1F of Example 6, the quantity of the second openings h2 and the third openings h3 for achieving conduction of the p-side electrode 50 with the p-pad electrode 70 was 32. In a plan view, the diameter of the third opening h3 of the semiconductor light-emitting element 1F was 32 μm.

In the semiconductor light-emitting element 1F of Example 6, the area of the n-side contact electrode 41 was 221642 $\mu m^2$. In the semiconductor light-emitting element 1F of Example 6, the area of the light-emitting layer 12 was 637398 $\mu m^2$.

Semiconductor Light-Emitting Element 1G of Example 7: See FIG. 14G

In the semiconductor light-emitting element 1G of Example 7, the quantity of n-side conductive portions 41*d* was 24. The quantity of the first openings h1 for disposing the n-side conductive portion 41*d* was 24.

In the semiconductor light-emitting element 1G of Example 7, the quantity of the second openings h2 and the third openings h3 for achieving conduction of the p-side electrode 50 with the p-pad electrode 70 was 21. In a plan view, the diameter of the third opening h3 of the semiconductor light-emitting element 1G was 32 μm.

In the semiconductor light-emitting element 1G of Example 7, the area of the n-side contact electrode 41 was 217560 $\mu m^2$. In the semiconductor light-emitting element 1G of Example 7, the area of the light-emitting layer 12 was 649189 $\mu m^2$.

Comparative Example

Subsequently, the structure of a semiconductor light-emitting element of Comparative Example will be described.

Figure 14H:
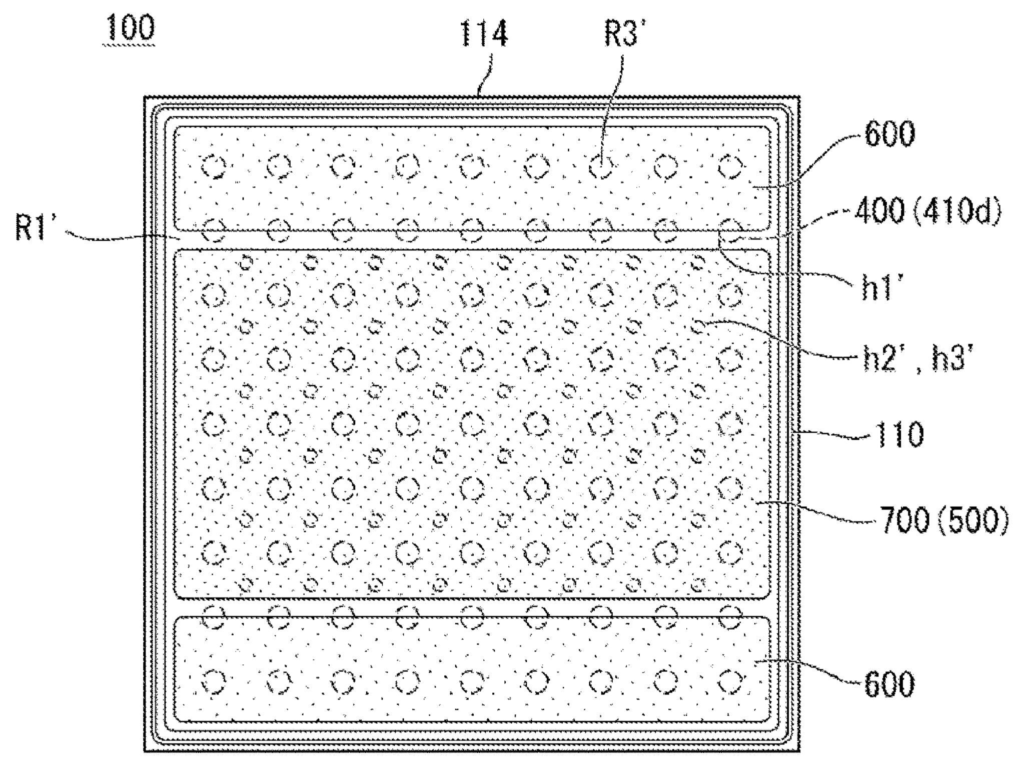
FIG. 14H is a schematic plan view of a semiconductor light-emitting element according to Comparative Example used in the first verification test.

Structure of Semiconductor Light-Emitting Element of Comparative Example: See FIG. 14H Similarly to the semiconductor light-emitting elements 1A to 1G of Examples 1 to 7, respectively, the semiconductor light-emitting element of Comparative Example illustrated in FIG. 14H included a semiconductor structure 110, an n-side electrode 400, n-pad electrodes 600, a first insulating film 120, a second insulating film 130, a p-side electrode 500, and a p-pad electrode 700 on a substrate 114. As the substrate 114, a sapphire substrate was used. The substrate 114 was a square having a side of 1 mm in a plan view. The semiconductor structure 110 included an n-side semiconductor layer, a light-emitting layer, and a p-side semiconductor layer. The n-side semiconductor layer included a first region R1', a second region located on the outer periphery of the first region R1', and a plurality of third regions R3' surrounded by the first region R1'. The first insulating film included a plurality of first openings h1', each disposed on the corresponding one of the plurality of third regions R3' and a plurality of second openings h2' disposed on the p-side semiconductor layer. The second insulating film included a plurality of third openings h3', each disposed at a position overlapping the corresponding one of the plurality of second openings h2'. The n-side electrode 400 was electrically connected to the n-side semiconductor layer through the plurality of first openings h1'. The n-side electrode 400 was electrically connected to the n-pad electrodes 600. The n-side semiconductor layer and each of the n-pad electrodes 600 were electrically connected via the n-side electrode 400. The p-pad electrode 700 was disposed on the second insulating film and was electrically connected to the A-side semiconductor layer through the plurality of third openings h3'. In a plan view, the p-pad electrode 700 covered the first region R1' and the plurality of third regions R3', and the plurality of first openings h1' were disposed around each of the plurality of third openings h3'. The semiconductor light-emitting element 100 of Comparative Example was different from the semiconductor light-emitting elements 1A to 1G of Examples 1 to 7, respectively in that the plurality of first openings h1' were also disposed under each of the n-pad electrodes 600. The semiconductor light-emitting element 100 of Comparative Example was different from the semiconductor light-emitting elements 1A to 1G of Examples 1 to 7, respectively in that a light-emitting layer was disposed under the n-pad electrodes 600. The semiconductor light-emitting element 100 of Comparative Example used the same material and had the same thickness, as those of the semiconductor light-emitting elements 1A to 1G of Examples 1 to 7, respectively.

In the semiconductor light-emitting element 100 of Comparative Example, the outer shape of the first region R1' was quadrangular in a plan view. The area of the outer shape of the first region R1' was 809657 μm$^2$. In the semiconductor light-emitting element 100 of Comparative Example, the outer shape of the p-pad electrode 700 was quadrangular in a plan view. In the semiconductor light-emitting element 100 of Comparative Example, the n-pad electrodes 600 were disposed at positions adjacent to the corresponding two sides opposing each other in a plan view among the sides of the substrate. The outer shape of the n-pad electrode 600 was quadrangular in a plan view.

In the semiconductor light-emitting element 100 of Comparative Example, the quantity of n-side conductive portions 410*d* was 81. One n-side conductive portion 410*d* had an area of 20 μm$^2$. The quantity of the first openings h1' for disposing the n-side conductive portion 410*d* was 81.

In the semiconductor light-emitting element 100 of Comparative Example, the quantity of the second openings h2' and the third openings h3' for achieving conduction of the p-side electrode 500 with the p-pad electrode 700 was 48. The diameter of the third opening h3' of the semiconductor light-emitting element 100 of Comparative Example was 32 μm.

In the semiconductor light-emitting element 100 of Comparative Example, the area of the n-side contact electrode was 91426 μm$^2$. In the semiconductor light-emitting element 100 of Comparative Example, the area of the light-emitting layer was 736190 μm$^2$.

Table 1 shows the quantity of the n-side conductive portions, the area of the n-side contact electrode, and the area of the light-emitting layer for each of Examples 1 to 7 and Comparative Example.

TABLE 1

| | Quantity of n-side conductive portions | Area of n-side contact electrode (μm$^2$) | Area of light-emitting layer (μm$^2$) |
|---|---|---|---|
| Example 1 | 156 | 259,008 | 529,465 |
| Example 2 | 120 | 247,704 | 562,117 |
| Example 3 | 76 | 233,888 | 602,025 |
| Example 4 | 69 | 231,690 | 608,374 |
| Example 5 | 52 | 226,352 | 623,793 |
| Example 6 | 37 | 221,642 | 637,398 |
| Example 7 | 24 | 217,560 | 649,189 |
| Comparative Example | 81 | 91,426 | 736,190 |

As shown in Table 1, the area of the n-side contact electrode increased as the quantity of the n-side conductive portions increased. The area of the light-emitting layer reduced as the quantity of the n-side conductive portions increased. The area of the n-side contact electrode 41 of each of the semiconductor light-emitting elements 1A to 1G of Examples 1 to 7, respectively was larger than the area of the n-side contact electrode of the semiconductor light-emitting element 100 of Comparative Example. The area of the light-emitting layer 12 of each of the semiconductor light-emitting elements 1A to 1G of Examples 1 to 7, respectively was smaller than the area of the light-emitting layer of the semiconductor light-emitting element 100 of Comparative Example.

In the semiconductor light-emitting element 100 of Comparative Example, the light-emitting layer was disposed under the n-pad electrodes 600. Thus, the area of the n-side contact electrode of the semiconductor light-emitting element 100 of Comparative Example was smaller than the area of the n-side contact electrode 41 of each of the semiconductor light-emitting elements 1A to 1G of Examples 1 to 7, respectively. The quantity of the n-side conductive portions 410*d* of the semiconductor light-emitting element 100 of Comparative Example was larger than that of each of Examples 3 to 7, but the area of the light-emitting layer of the semiconductor light-emitting element 100 of Comparative Example was larger than the area of the light-emitting layer 12 of each of the semiconductor light-emitting elements 1A to 1G of Examples 1 to 7, respectively.

Figure 15:
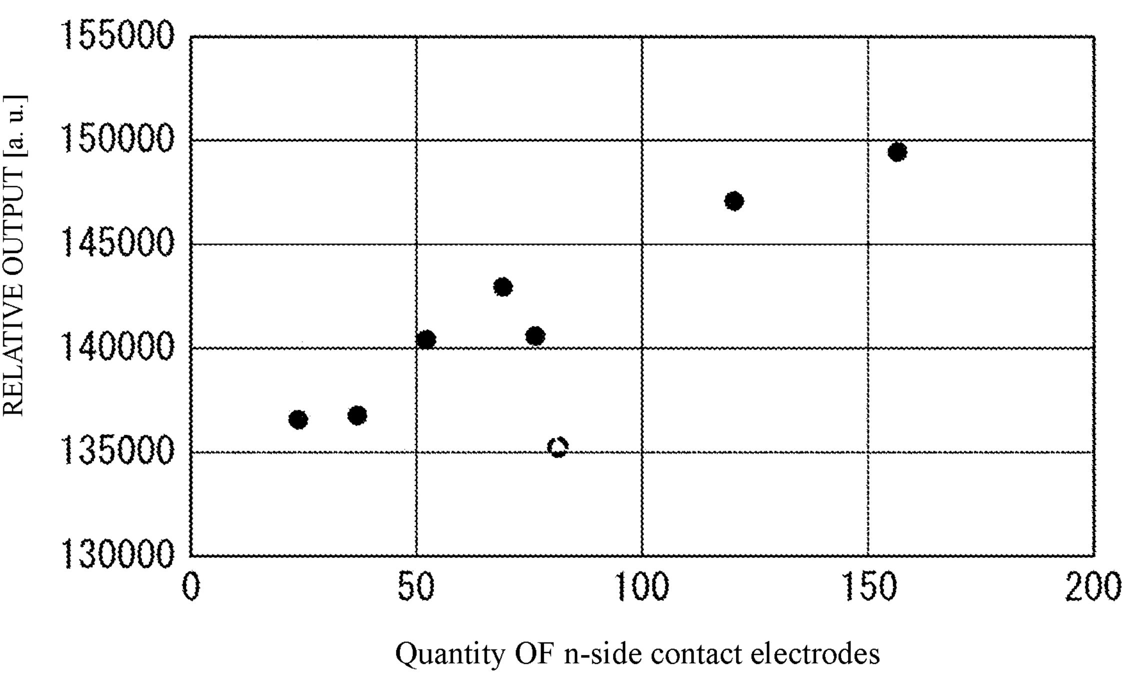
FIG. 15 is a graph showing a relationship between the quantity of n-side conductive portions and the relative output of the semiconductor light-emitting element, according to Examples and Comparative Example as the first verification test.
Figure 16:
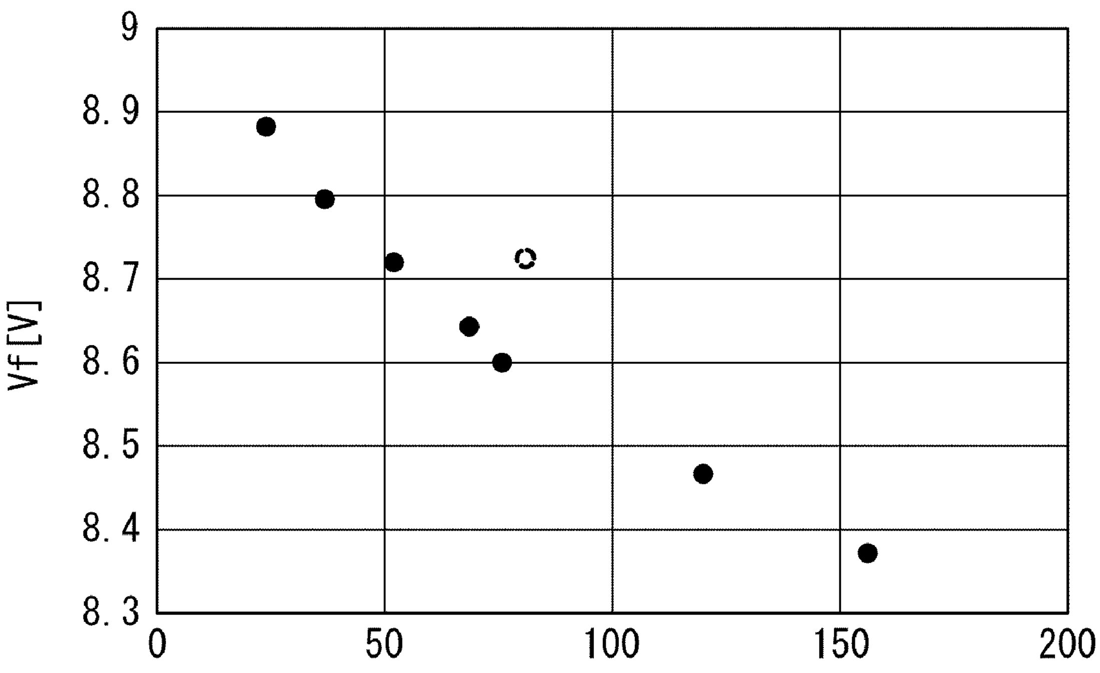
FIG. 16 is a graph showing a relationship between the quantity of n-side conductive portions and a forward voltage Vf of the semiconductor light-emitting element, according to Examples and Comparative Example as the first verification test.

Subsequently, for each of Examples 1 to 7 and Comparative Example, relative output, which is an index of brightness, and a forward voltage Vf were measured when a forward current of 350 mA was applied to the semiconductor light-emitting element. The relative output was a value measured by causing the semiconductor light-emitting element to emit light by applying current between the p-side semiconductor layer and the n-side semiconductor layer of the semiconductor light-emitting element in a wafer state and receiving the emitted light by a photodiode. A large value of the relative output indicates being bright, and a small value indicates being dark. The values of the forward voltage Vf in Table 2 are values of the forward voltage Vf obtained by rounding off the measured values to the third decimal place. Table 2 shows the relationship among the quantity of the n-side conductive portions, the relative output [a. u.], and the forward voltage Vf (V) in Examples 1 to 7 and Comparative Example. FIG. 15 is a graph showing the relationship between the quantity of the n-side conductive portions and the relative output. In FIG. 15, the vertical axis represents the relative output, and the horizontal axis represents the quantity of the n-side conductive portions. FIG. 16 is a graph showing the relationship between the quantity of the n-side conductive portions and the forward voltage Vf. In FIG. 16, the vertical axis represents the forward voltage Vf, and the horizontal axis represents the quantity of the n-side conductive portions. In FIGS. 15 and 16, the results of Examples 1 to 7 are indicated by black circles, and the results of Comparative Example are indicated by white circles.

TABLE 2

| | Quantity of n-side conductive portions | Relative output [a.u.] | Forward voltage Vf (V) |
|---|---|---|---|
| Example 1 | 156 | 149,483 | 8.37 |
| Example 2 | 120 | 147,134 | 8.46 |
| Example 3 | 76 | 140,655 | 8.60 |
| Example 4 | 69 | 143,022 | 8.64 |
| Example 5 | 52 | 140,472 | 8.72 |
| Example 6 | 37 | 136,944 | 8.75 |
| Example 7 | 24 | 136,708 | 8.89 |
| Comparative Example | 81 | 135,386 | 8.72 |

The graph of FIG. 15 and the results of Table 2 indicate that the semiconductor light-emitting elements 1A to 1G of Examples 1 to 7, respectively obtained higher relative output than that in the semiconductor light-emitting element 100 of Comparative Example. In Examples 1 to 7, the larger the quantity of the n-side conductive portions 41*d* was, the higher the relative output was obtained. It was confirmed that a high relative output was obtained even when the quantity of the n-side conductive portions 41*d* was increased and the area of the light-emitting layer 12 was reduced. This is assumed to be due to reduction in the distance between a part in which the n-side wiring portion 42 and the n-side contact electrode 41 are electrically connected and a part in which the p-side electrode 50 and the p-pad electrode 70 are electrically connected, which is caused by increase in the quantity of n-side conductive portions 41*d* with respect to the same first region R1.

The graph of FIG. 16 and the results of Table 2 indicate that in Examples 1 to 7, the larger the quantity of the n-side conductive portions 41*d* was, the lower the forward voltage Vf was obtained. In Examples 1 to 5, the forward voltage Vf equal to that of the semiconductor light-emitting element 100 of Comparative Example or lower than that of the semiconductor light-emitting element 100 of Comparative Example was obtained.

From the above result, it was confirmed that a semiconductor light-emitting element having a high relative output and the low forward voltage Vf could be obtained by reducing the distance between a part in which the n-side wiring portion 42 and the n-side contact electrode 41 are electrically connected and a part in which the p-side electrode 50 and the p-pad electrode 70 are electrically connected.

Description of Second Verification Test

A second verification test was conducted regarding the semiconductor light-emitting element of the present disclosure. In the second verification test, semiconductor light-emitting elements of Examples 1 to 4, 8, and 9 described below were manufactured.

Examples 1 to 4, 8, and 9 to be subjected to the second verification test were different in the thickness of the semiconductor structure 10 and the electrode to be subjected to the first verification test. The semiconductor light-emitting elements of Examples 1 to 4, 8, and 9 to be subjected to the second verification test had substantially the same structure as that of the first verification test except for the configuration described below. Hereinafter, this will be specifically described in detail.

As the semiconductor structure 10, a nitride semiconductor in which an n-type semiconductor layer that includes an AlGaN layer having an Al composition ratio of 60%, and a p-type semiconductor layer that includes an AlGaN layer having an Al composition ratio of 40% and a GaN layer disposed on the AlGaN layer are layered was used. As the n-side wiring portion 42 of the n-side electrode 40, a layered structure in which a Ti layer having a thickness of 1.6 nm, an Ru layer having a thickness of 500 nm, and a Ti layer having a thickness of 10 nm are layered in order was used. As the p-side electrode 50, a layered structure in which an Ru layer having a thickness of 340 nm, an Ni layer having a thickness of 9 nm, and an Au layer having a thickness of 7 nm are layered in order was used.

The quantity of the n-side conductive portions, the area ($\mu m^2$) of the n-side contact electrode, and the area ($\mu m^2$) of the light-emitting layer of the semiconductor light-emitting elements of Examples 1 to 4 to be subjected to the second verification test were the same as those of the semiconductor light-emitting elements of Examples 1 to 4, respectively, described in the first verification test described above.

In Examples 8 and 9, the quantity of the n-side conductive portions 41*d* and the quantity of the third openings h3 were mainly different from those in Examples 1 to 4. For example, in Example 8, the interval between the n-side conductive portion 41*d* and the third opening h3 was smaller than that of Example 1 illustrated in FIG. 14A, and the quantity of the n-side conductive portions 41*d* and the quantity of the third openings h3 were greater by 60 and 84, respectively, than those in Example 1. Similarly, in Example 9, the interval between the n-side conductive portion 41*d* and the third opening h3 was smaller than those in Example 1 illustrated in FIG. 14A, and the quantity of the n-side conductive portions 41*d* and the quantity of the third openings h3 were greater by 29 and 27, respectively, than those in Example 1. Thus, in Examples 8 and 9, the total area of the n-side contact electrode 41 was increased and the total area of the light-emitting layer 12 was reduced as compared with Examples 1 to 7.

In Example 8, the quantity of the n-side conductive portions 41*d* was 216, and the quantity of the first openings h1 for disposing the n-side conductive portion 41*d* was 216. In Example 8, the quantity of the second openings h2 and the third openings h3 for achieving conduction of the p-side electrode 50 with the p-pad electrode 70 was 229. The diameter of the third opening h3 of Example 8 was 6 μm.

In Example 9, the quantity of the n-side conductive portions 41*d* was 185, and the quantity of the first openings h1 for disposing the n-side conductive portion 41*d* was 185. In Example 9, the quantity of the second openings h2 and the third openings h3 for achieving conduction of the A-side electrode 50 with the p-pad electrode 70 was 172. The diameter of the third opening h3 of Example 9 was 6 Examples 8 and 9 include the area of the n-side contact electrode and the area of the light-emitting layer shown in Table 3 below.

TABLE 3

| | Quantity of n-side conductive portions | Area of n-side contact electrode ($\mu m^2$) | Area of light-emitting layer ($\mu m^2$) |
|---|---|---|---|
| Example 8 | 216 | 277,848 | 475,045 |
| Example 9 | 185 | 268,114 | 503,162 |
| Example 1 | 156 | 259,008 | 529,465 |
| Example 2 | 120 | 247,704 | 562,117 |
| Example 3 | 76 | 233,888 | 602,025 |
| Example 4 | 69 | 231,690 | 608,374 |

Figure 17:
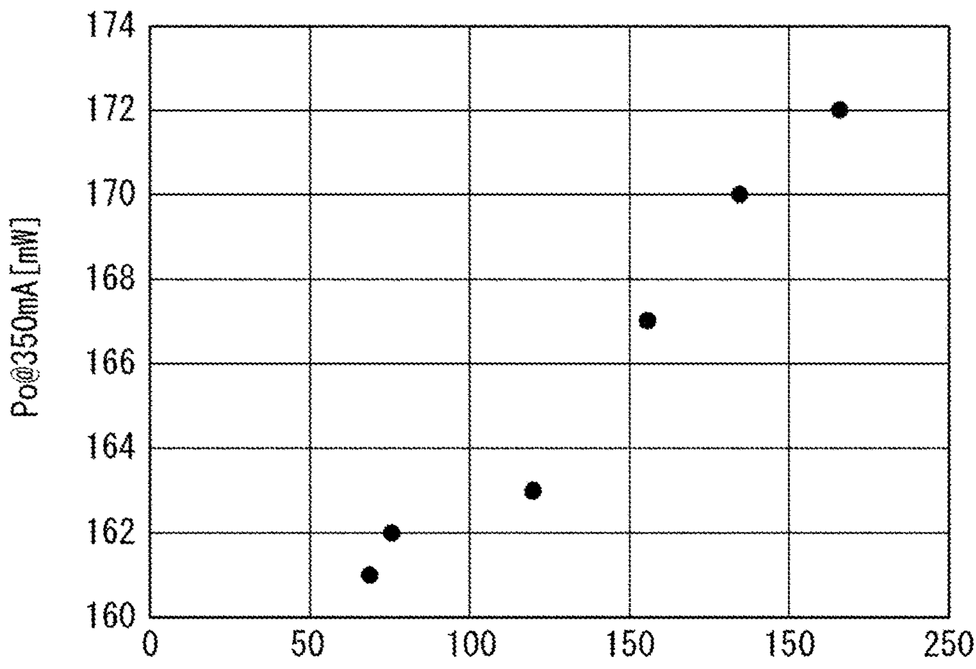
FIG. 17 is a graph showing a relationship between the quantity of n-side conductive portions and the output of the semiconductor light-emitting element, according to Examples as the second verification test.
Figure 18:
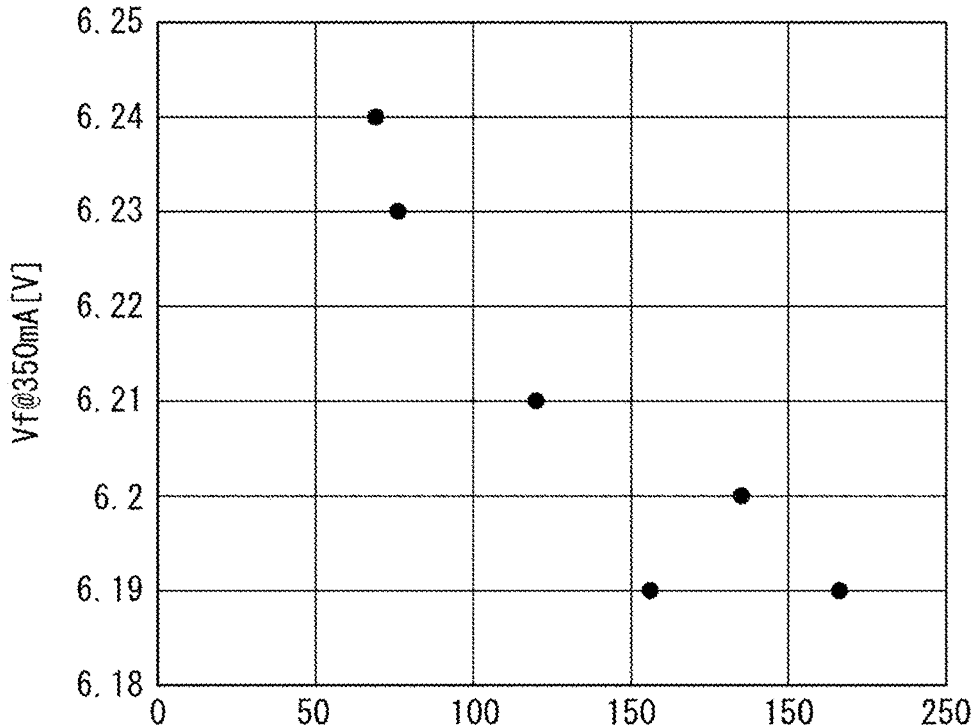
FIG. 18 is a graph showing a relationship between the quantity of n-side conductive portions and the forward voltage Vf of the semiconductor light-emitting element, according to Examples as the second verification test.

Subsequently, for each of Examples 1 to 4, 8, and 9, the output (mW) and the forward voltage Vf were measured when a forward current of 350 mA was applied to the semiconductor light-emitting element. Table 4 shows the relationship between the quantity of the n-side conductive portions, the output (mW), and the forward voltage Vf (V) for each of Examples 1 to 4, 8, and 9. FIG. 17 is a graph (vertical axis: output (mW) and horizontal axis: quantity of n-side conductive portions) showing the relationship between the quantity of the n-side conductive portions and the output, and FIG. 18 is a graph (vertical axis: forward voltage (V) and horizontal axis: quantity of n-side conductive portions) showing the relationship between the quantity of the n-side conductive portions and the forward voltage (V).

TABLE 4

| | Quantity of n-side conductive portions | Output (mW) | Forward voltage Vf(V) |
|---|---|---|---|
| Example 8 | 216 | 172 | 6.19 |
| Example 9 | 185 | 170 | 6.20 |
| Example 1 | 156 | 167 | 6.19 |
| Example 2 | 120 | 163 | 6.21 |
| Example 3 | 76 | 162 | 6.23 |
| Example 4 | 69 | 161 | 6.24 |

The graph of FIG. 17 and the results of Table 4 indicate that the semiconductor light-emitting elements of Examples 1 to 4, 8, and 9 obtained a high output. In Examples 1 to 4, 8, and 9, the larger the quantity of the n-side conductive portions 41*d* was, the higher the output was obtained. Similarly to the result of the first verification test, also in the second verification test, it was confirmed that a high output was obtained even when the quantity of the n-side conductive portions 41*d* was increased and the area of the light-emitting layer 12 was reduced. This is thought to be because the distance between a part in which the n-side wiring portion 42 and the n-side contact electrode 41 are electrically connected and a part in which the p-side electrode 50 and the p-pad electrode 70 are electrically connected becomes smaller by disposing a larger quantity of n-side conductive portions 41*d* with respect to the first region R1 having the same area.

The graph of FIG. 18 and the results of Table 4 indicate that, in Examples 1 to 4, 8, and 9, the larger the quantity of the n-side conductive portions 41*d* was, the lower the forward voltage Vf was obtained. From the result of the second verification test, it was confirmed that a semiconductor light-emitting element having a high output and the low forward voltage Vf could be obtained by reducing the distance between a part in which the n-side wiring portion 42 and the n-side contact electrode 41 are electrically connected and a part in which the p-side electrode 50 and the p-pad electrode 70 are electrically connected.

The embodiments disclosed are illustrative in all respects and are not intended to be the basis of limiting interpretation. Accordingly, the technical scope of the present disclosure is not intended to be construed to encompass solely the embodiments described above, but rather is defined based on the claims. In addition, the technical scope of the present disclosure includes all variation examples within the meaning and scope equivalent to the scope of claims.

What is claimed is:

1. A semiconductor light-emitting element comprising:

a semiconductor structure comprising:

an n-side semiconductor layer comprising a first region, a second region located on an outer periphery of the first region in a plan view, and a plurality of third regions surrounded by the first region in a plan view, a light-emitting layer disposed on the first region, and a p-side semiconductor layer disposed on the light-emitting layer;

a first insulating film disposed on the semiconductor structure and defining a plurality of first openings, each located above a corresponding one of the plurality of third regions, and a plurality of second openings located above the p-side semiconductor layer;

an n-side electrode disposed on the first insulating film and electrically connected to the n-side semiconductor layer through the plurality of first openings;

at least one n-pad electrode disposed in the second region outward of the light-emitting layer and the p-side semiconductor layer in a plan view, the at least one n-pad electrode being electrically connected to the n-side electrode;

a second insulating film disposed on the first insulating film and defining a plurality of third openings, each located at a position overlapping a corresponding one of the plurality of second openings; and a p-pad electrode disposed on the second insulating film and electrically connected to the p-side semiconductor layer through the plurality of third openings, wherein:

the p-pad electrode covers the first region and the plurality of third regions in a plan view, two or more of the plurality of first openings are located around a corresponding one of the plurality of third openings in a plan view, the n-side electrode comprises an n-side outer-peripheral conductive portion in contact with the n-side semiconductor layer in the second region not overlapping the n-pad electrode in a plan view, the n-side outer-peripheral conductive portion is disposed outward of an outer edge of the p-pad electrode in a plan view, and the second insulating film defines a fifth opening located between a first opening of the plurality of first openings that is located closest to the n-side outer-peripheral conductive portion and the n-side outer-peripheral conductive portion in a plan view.

2. The semiconductor light-emitting element according to claim 1, wherein the plurality of first openings and the plurality of third openings are arranged in alternate rows in a plan view.

3. The semiconductor light-emitting element according to claim 1, wherein the light-emitting layer comprises an AlGaN layer having an Al composition ratio in a range of 40% to 60%.

4. The semiconductor light-emitting element according to claim 1, wherein a plurality of the n-pad electrodes are disposed outward of an outer edge of the p-pad electrode in a plan view.

5. The semiconductor light-emitting element according to claim 1, wherein:

the semiconductor structure has a rectangular shape in a plan view, and the n-pad electrode is disposed in the second region located at a corner portion of the semiconductor structure of the second region.

6. The semiconductor light-emitting element according to claim 1, wherein the p-pad electrode has an octagonal shape in a plan view.

7. The semiconductor light-emitting element according to claim 1, wherein an area of the p-pad electrode is larger than an area of the light-emitting layer in a plan view.

8. The semiconductor light-emitting element according to claim 1, wherein a bonding member is disposed on the p-pad electrode above the plurality of third openings.

9. The semiconductor light-emitting element according to claim 1, wherein:

the n-side electrode comprises a plurality of n-side conductive portions and an n-side wiring portion, each of the plurality of n-side conductive portions is in contact with the n-side semiconductor layer through a corresponding one of the plurality of first openings, and the n-side wiring portion electrically connects each of the plurality of n-side conductive portions and the n-pad electrode.

10. The semiconductor light-emitting element according to claim 1, wherein the second insulating film defines a fourth opening located between one of the plurality of first openings that is located closest to the n-pad electrode and the n-pad electrode in a plan view.

11. The semiconductor light-emitting element according to claim 1, wherein:

the first insulating film defines a sixth opening having an area larger than an area of one of the plurality of first openings in a plan view, the sixth opening has an elliptical shape in a plan view, and the fifth opening is located between the sixth opening and the n-side outer-peripheral conductive portion in a plan view.

12. The semiconductor light-emitting element according to claim 1, wherein:

an area of the fifth opening is larger than an area of one of the plurality of third openings in a plan view, and the fifth opening has an elliptical shape in a plan view.

* * * * *